US008923032B2

(12) United States Patent
Shimakawa et al.

(10) Patent No.: US 8,923,032 B2
(45) Date of Patent: Dec. 30, 2014

(54) CROSSPOINT NONVOLATILE MEMORY DEVICE AND FORMING METHOD THEREOF

(71) Applicant: Panasonic Corporation, Osaka (JP)

(72) Inventors: Kazuhiko Shimakawa, Osaka (JP); Akifumi Kawahara, Kyoto (JP); Ryotaro Azuma, Osaka (JP); Ken Kawai, Osaka (JP)

(73) Assignee: Panasonic Corporation, Osaka (JP)

( * ) Notice: Subject to any disclaimer, the term of this patent is extended or adjusted under 35 U.S.C. 154(b) by 1 day.

(21) Appl. No.: 13/983,314

(22) PCT Filed: Nov. 13, 2012

(86) PCT No.: PCT/JP2012/007273
§ 371 (c)(1),
(2), (4) Date: Aug. 2, 2013

(87) PCT Pub. No.: WO2013/084412
PCT Pub. Date: Jun. 13, 2013

(65) Prior Publication Data
US 2014/0112054 A1    Apr. 24, 2014

(30) Foreign Application Priority Data

Dec. 7, 2011  (JP) ................. 2011-268372

(51) Int. Cl.
*G11C 13/00* (2006.01)
(52) U.S. Cl.
CPC .............. *G11C 13/004* (2013.01); *G11C 13/00* (2013.01); *G11C 13/0002* (2013.01)
USPC ........................................................ 365/148
(58) Field of Classification Search
None
See application file for complete search history.

(56) References Cited

U.S. PATENT DOCUMENTS

| 7,324,370 B2 | 1/2008 | Smith et al. |
| 7,372,753 B1 | 5/2008 | Rinerson et al. |
| 7,965,565 B2 | 6/2011 | Jung et al. |

(Continued)

FOREIGN PATENT DOCUMENTS

| JP | 2006-228414 | 8/2006 |
| JP | 4625510 | 2/2011 |

(Continued)

OTHER PUBLICATIONS

International Search Report issued Dec. 25, 2012 in International (PCT) Application No. PCT/JP2012/007273.

*Primary Examiner* — James G Norman
(74) *Attorney, Agent, or Firm* — Wenderoth, Lind & Ponack, L.L.P.

(57) ABSTRACT

A sense amplification circuit includes a sneak current compensating load current supply unit that selectively switches a load current among load currents having different current amounts and supplies the load current to a bit line selected by a column selection circuit. The sense amplification circuit outputs 'L' level when a current amount of the load current is more than a reference current amount, and outputs 'H' level when the current amount is less than the reference current amount. A control circuit adjusts the current amount to a predetermined current amount that causes the sense amplification circuit to output 'H' level. After the adjustment, the control circuit performs control to supply the load current having the predetermined current amount and controls the writing unit to keep the application until the sense amplification circuit outputs 'L' level.

11 Claims, 15 Drawing Sheets

(56) References Cited

U.S. PATENT DOCUMENTS

| | | |
|---|---|---|
| 2005/0169038 A1 | 8/2005 | Inoue et al. |
| 2006/0181915 A1 | 8/2006 | Oh et al. |
| 2011/0032746 A1* | 2/2011 | Maejima et al. ............. 365/148 |
| 2011/0235394 A1 | 9/2011 | Sasaki et al. |
| 2011/0235396 A1 | 9/2011 | Sasaki |
| 2011/0235401 A1 | 9/2011 | Kunitake et al. |
| 2012/0120712 A1 | 5/2012 | Kawai et al. |
| 2013/0044534 A1 | 2/2013 | Kawai et al. |

FOREIGN PATENT DOCUMENTS

| | | |
|---|---|---|
| JP | 2011-198430 | 10/2011 |
| JP | 2011-198445 | 10/2011 |
| JP | 2011-204297 | 10/2011 |
| WO | 2010/143396 | 12/2010 |
| WO | 2011/121970 | 10/2011 |

* cited by examiner

CROSSPOINT NONVOLATILE MEMORY DEVICE AND FORMING METHOD THEREOF

TECHNICAL FIELD

The present invention relates to crosspoint nonvolatile memory devices having variable resistance elements, and particularly to forming performed by the devices.

BACKGROUND ART

In recent years, with the advance of digital technologies, electronic devices such as portable information devices and information home appliances have been increasingly sophisticated. There is therefore a greater demand for a nonvolatile memory device with higher capacity, less writing power, higher writing/reading speed, and longer service life.

In order to meet the demand, refinement of a flash memory with existing floating gates has been progressed. On the other hand, as a substitute element for a flash memory, a nonvolatile memory device including memory elements each having a so-called variable resistance element has been researched and developed. The variable resistance element has a resistance value that changes according to electrical signal. The changed resistance value is kept even after turning the electrical signal off (in other words, kept in a nonvolatile manner). The variable resistance element is therefore capable of holding data according to the change of the resistance vale.

Typical examples of the variable resistance element are a Magnetic Random Access Memory (MRAM), a Phase Change Random Access Memory (PRAM), a Resistec Random Access Memory (ReRAM), and the like.

One example of a structure of a nonvolatile memory device having such a variable resistance element is known as a crosspoint structure. In the crosspoint structure, each of memory cells is provided, between a bit line and a word line, at a corresponding crosspoint between the bit line and the word line which are arranged perpendicular to each other. Each of the memory cells includes a memory element that is a single variable resistance element. Or, each memory cell includes a variable resistance element and a switching element which are connected in series. The switching element, such as a diode, has nonlinear characteristics. An electrode of the memory element is connected to a word line, and the other electrode is connected to a bit line. The crosspoint structure has characteristics of being more suitable for large-scale integration than a so-called 1T1R (1 transistor and 1 resistance) structure where a variable resistance element is connected to a bit line via an access transistor.

In the crosspoint structure, a plurality of memory cells are arranged in an array to form a crosspoint cell array. In the crosspoint structure, in order to detect (read) a resistance value of a memory element included in a target memory cell, a reading voltage is applied to a corresponding bit line and a corresponding word line. When the reading voltage is applied, a current flows in the target memory cell to be detected (target to be read), but a current also flows via the other memory cells (memory cells other than the target memory cell) connected in parallel to the target memory cell along upper and lower lines, namely, a bit line and a word line. In the description, the "current (that) also flows via the other memory cells" is referred to as a sneak current.

The sneak current changes according to a state of pieces of data stored in a crosspoint cell array (namely, resistance values of memory elements included in all of memory cells in the crosspoint cell array to which a target memory cell to be detected belongs, and distribution of the resistance values). Therefore, a current detected in reading includes a sneak current having a value that constantly varies. Such a sneak current prevents accurate detection of a resistance value of a memory element included in a target memory cell to be read (see Patent Literature 1, for example).

In the meantime, it has been generally known that an operation called forming is necessary to reversibly change a resistance stage of a variable resistance element (see Patent Literatures 2 and 3, for example).

CITATION LIST

Patent Literatures

[PTL 1] Japanese Patent No. 4625510
[PTL 2] PCT International Publication No. 2011/121970
[PTL 3] Japanese Unexamined Patent Application Publication No. 2011-198445

SUMMARY OF INVENTION

Technical Problem

Meanwhile, in a crosspoint memory device, as the number of memory cells for which forming has been performed is increased with the progress of the forming, the number of memory cells each having a lower resistance value than an resistance value in an initial state is increased. As a result, a sneak current is gradually increased. In order to perform forming by appropriately applying a predetermined forming pulse according to a resistance state of a target memory cell while a resistance value of the target memory cell is monitored, it is necessary to distinguish a sneak current amount that constantly varies from a current for the forming on the target memory cell, and thereby makes a forming determination. However, such current distinction is not easy, and it is therefore difficult to achieve stable forming.

The present invention solves the above problem. An object of the present invention is to provide a crosspoint nonvolatile memory device and a forming method used by the device which are capable of achieving stable forming.

Solution to Problem

In accordance with an aspect of the present invention for achieving the object, there is provided a crosspoint nonvolatile memory device, including: a plurality of word lines parallel to each other on a first plane; a plurality of bit lines parallel to each other on a second plane parallel to the first plane, the bit lines three-dimensionally crossing the word lines; a crosspoint memory cell array in which memory cells are arrayed in rows and columns, the memory cells being arranged at respective three-dimensional crosspoints between the word lines and the bit lines, and each of the memory cells including a variable resistance element that is reversibly changed between a first resistance state and a second resistance state that has a higher resistance value than a resistance value of the first resistance state, when receiving an electrical signal; a word line selector that selects a world line from the word lines; a bit line selector that selects a bit line from the bit lines; a writing circuit that applies a forming pulse for forming to a predetermined memory cell among the memory cells, the predetermined memory cell being selected by selecting the bit line by the bit line selector and selecting the word line by the word line selector; a sense amplification circuit electrically connected to the bit line; and a control circuit that controls the sense amplification circuit and the writing circuit, wherein, in an initial state after manufacturing the variable resistance element, the variable resistance element is in a third resistance state that has a higher resistance value than the resistance value of the second resistance state, and after forming is performed, a resistance state of the variable resistance element is changed from the initial state to a state where the resistance state is reversibly changeable between the first resistance state and the second resistance state, the sense amplification circuit includes a current source that selectively switches a load current among load currents having different current amounts and supplies the load current to the bit line selected by the bit line selector, and the sense amplification circuit outputting a first logical value when a current amount of the load current flowing into the bit line selected by the bit line selector is more than a reference current amount, and outputting a second logical value when the current amount is less than the reference current amount, and when the predetermined memory cell is selected, before the application of the forming pulse to the predetermined memory cell, (i) the control circuit adjusts the current amount of the load current supplied from the current source to a predetermined current amount that causes the sense amplification circuit to output the second logical value, and (ii) after the adjustment, the control circuit (ii-1) controls the current source to supply the load current having the predetermined current amount, and (ii-2) controls the writing unit to keep applying the forming pulse to the predetermined memory cell until the sense amplification circuit outputs the first logical value.

These general and specific aspects may be implemented using a system, a method, an integrated circuit, a computer program, or a computer-readable recording medium such as a Compact Disc Read Only Memory (CD-ROM), or any combination of systems, methods, integrated circuits, computer programs, or computer-readable recording media.

Advantageous Effects of Invention

The crosspoint nonvolatile memory device and the forming method used by the device are capable of determining a resistance state of a selected memory cell by eliminating influence of a sneak current in a forming process performed on the selected memory cell in an initial state, thereby achieving stable forming.

DESCRIPTION OF EMBODIMENTS (Underlying Knowledge Forming Basis of the Present Disclosure)

As described in "Background Art", it is generally known that, in order to cause a variable resistance element to perform reversible resistance changing, it is necessary to perform an operation called forming. A technique relating to the forming is disclosed in Patent Literature 2.

As a means for causing a crosspoint semiconductor memory device to perform correct forming, Patent Literature 3 discloses a structure including a detection circuit that detects a leak current flowing in a word line WL in performing forming. Patent Literature 3 discloses that, in performing forming, current supply is performed to supply a constant current to a bit line BL, and at the same time, a compensating current having the same current value as that of the leak current is supplied to the bit lie BL based on the leak current detected by the detection circuit.

Moreover, Patent Literature 1 discloses a semiconductor memory device having a structure for preventing a sneak current from decreasing a detection sensitivity of a resistance value of a memory element included in a memory cell.

Figure 11:
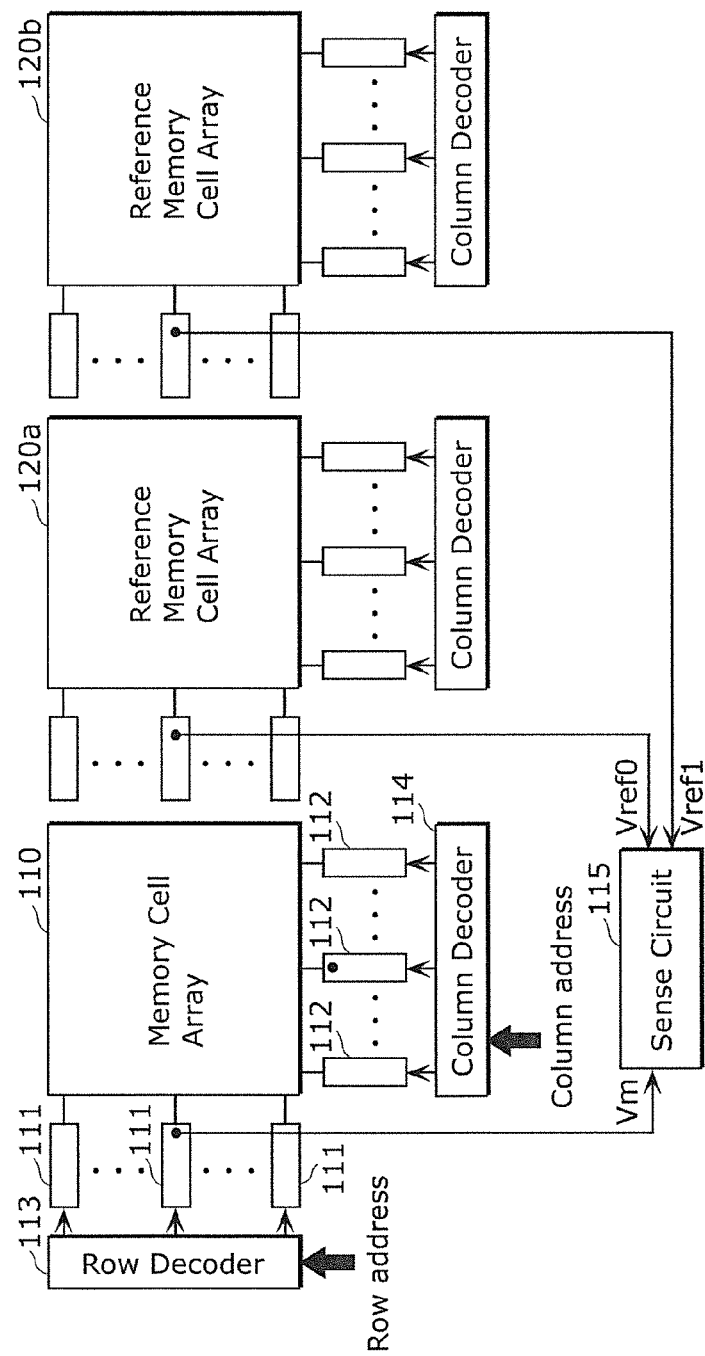
FIG. 11 is a block diagram showing a structure of a main part of a semiconductor memory device disclosed in Patent Literature 1.

FIG. 11 is a block diagram showing a structure of a main part of the semiconductor memory device disclosed in Patent Literature 1.

The semiconductor memory device includes: a crosspoint memory cell array 110; a data line drive circuit 111 that drives data lines individually; a bit line drive circuit 112 that drives bit lines individually; a column decoder 113 that selects, from a plurality of data lines, a data line to be connected to a selected memory cell from which data is to be read; and a column decoder 114 that selects, from a plurality of bit lines, a bit line to be connected to the selected memory cell.

The semiconductor memory device further includes two reference memory cell arrays 120a and 120b for reference voltage generation. Each of the reference memory cell arrays 120a and 120b has the same size as that of the memory cell array 110, and includes the same memory cells as included in the memory cell array 110. The semiconductor memory device also includes a sense circuit 115. The sense circuit 115 generates reference voltage levels Vref0 and Vref1 from output voltages of the reference memory cell arrays 120a and 120b. The sense circuit 115 also generates a reading voltage level Vm from a voltage level of a selected data line of the memory cell array 110. The sense circuit 115 compares the reading voltage level to the reference voltage level to examine a memory state (resistance state) of the selected memory cell.

For the reference memory cell array 120a, a state of a current (current state) is set so that a current flowing in a selected data line of a high-resistance memory cell that is a selected memory cell having a high resistance state is in a maximum state depending on a distribution pattern of resistance states of non-selected memory cells of the memory cell array. On the other hand, for the reference memory cell array 120b, a current state is set so that a current flowing in a selected data line of a low-resistance memory cell that is a selected memory cell having a low resistance state is in a minimum state depending on a distribution pattern of resistance states of non-selected memory cells of the memory cell array. The sense circuit 115 compares a current flowing in the selected memory cell to a current in an intermediate state between the maximum state and the minimum state, thereby detecting a resistance state of the selected memory cell.

Figure 12A:
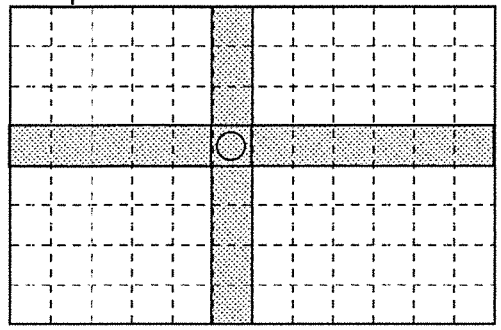
FIG. 12A is a diagram showing an example of data set to a reference memory array by the semiconductor memory device disclosed in Patent Literature 1.
Figure 12B:
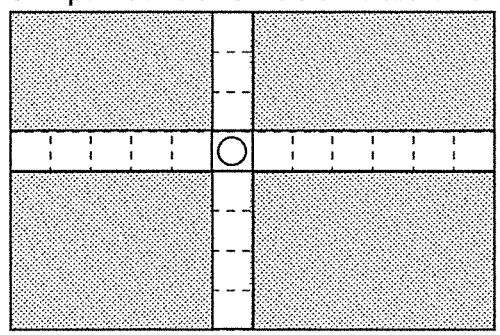
FIG. 12B is a diagram showing an example of data set to a reference memory array by the semiconductor memory device disclosed in Patent Literature 1.

FIGS. 12A and 12B are diagrams showing examples of data set to the reference memory cell arrays 120a and 120b, respectively. FIG. 12A shows a pattern A set to the reference memory cell array 120a, while FIG. 12B shows a pattern C set to the reference memory cell array 120b.

In this case, the reference memory cell array 120a achieves the first current state where a current flowing in a selected data line when reading data from a selected memory cell in a high resistance state is in a maximum state depending on a distribution pattern of electrical resistance states of the other non-selected memory cells. Therefore, the reference memory cell array 120a functions as a first reference current generation circuit. On the other hand, the reference memory cell array 120b achieves the second current state where a current flowing in a selected data line when reading data from a selected memory cell in a low resistance state is in a minimum state depending on a distribution pattern of electrical resistance states of the other non-selected memory cells. Therefore, the reference memory cell array 120b functions as a second reference current generation circuit.

In a crosspoint memory cell array, an amount of a sneak current changes according to writing data. Therefore, (a) a writing pattern (pattern A) of a high resistance state where a current flowing in a selected data line is considered as a maximum current and (b) a writing pattern (pattern C) of a low resistance state where the current is considered as a minimum state are prepared. Then, resistance state of the selected memory cell is detected with reference to an intermediate state between the maximum and minimum states. As a result, it is possible to achieve stable reading.

However, the structure shown in FIG. 11 needs to prepare a plurality of reference cell arrays each having the same size as that of the memory cell array, and there is therefore a problem of increasing a chip size.

From another viewpoint, the following problem is considered for a variable resistance element.

As disclosed in Patent Literature 2, a variable resistance element needs to perform at least one filament forming operation called forming after manufacturing. The forming allows resistance to reversibly change. A resistance value of a variable resistance element in an initial state before forming is in a high resistance state (hereinafter, referred to as a super high resistance state) that is higher than a normal high resistance state. Then, while a resistance value of a target memory cell is kept monitored, a predetermined forming pulse is appropriately applied to the target memory cell according to the resistance state.

Here, in a crosspoint memory device, as the number of memory cells for which forming has been performed is increased with the progress of the forming, the number of memory cells each having a lower resistance value than an resistance value in an initial state is increased. As a result, a sneak current is gradually increased. In order to perform forming by appropriately applying a predetermined forming pulse according to a resistance state of a target memory cell while a resistance value of the target memory cell is monitored, it is necessary to distinguish a sneak current amount that constantly varies from a current for the forming on the target memory cell, and thereby makes a forming determination. However, such current distinction is not easy, and it is therefore difficult to achieve stable forming.

Here, it is considered that this problem is solved by applying the technique disclosed in Patent Literature 1 to forming. More specifically, it is considered that a state where forming has not been performed on all memory cells in one of the reference memory cell arrays is achieved, and, on the other hand, a state where forming has not been performed on only one memory cell is achieved, and then, a forming determination is made with reference to an intermediate state of these states. However, as described earlier, this method causes a problem of increasing a chip size.

In accordance with an aspect of the present invention for achieving the object, there is provided a crosspoint nonvolatile memory device, including: a plurality of word lines parallel to each other on a first plane; a plurality of bit lines parallel to each other on a second plane parallel to the first plane, the bit lines three-dimensionally crossing the word lines; a crosspoint memory cell array in which memory cells are arrayed in rows and columns, the memory cells being arranged at respective three-dimensional crosspoints between the word lines and the bit lines, and each of the memory cells including a variable resistance element that is reversibly changed between a first resistance state and a second resistance state that has a higher resistance value than a resistance value of the first resistance state, when receiving an electrical signal; a word line selector that selects a world line from the word lines; a bit line selector that selects a bit line from the bit lines; a writing circuit that applies a forming pulse for forming to a predetermined memory cell among the memory cells, the predetermined memory cell being selected by selecting the bit line by the bit line selector and selecting the word line by the word line selector; a sense amplification circuit electrically connected to the bit line; and a control circuit that controls the sense amplification circuit and the writing circuit, wherein, in an initial state after manufacturing the variable resistance element, the variable resistance element is in a third resistance state that has a higher resistance value than the resistance value of the second resistance state, and after forming is performed, a resistance state of the variable resistance element is changed from the initial state to a state where the resistance state is reversibly changeable between the first resistance state and the second resistance state, the sense amplification circuit includes a current source that selectively switches a load current among load currents having different current amounts and supplies the load current to the bit line selected by the bit line selector, and the sense amplification circuit outputting a first logical value when a current amount of the load current flowing into the bit line selected by the bit line selector is more than a reference current amount, and outputting a second logical value when the current amount is less than the reference current amount, and when the predetermined memory cell is selected, before the application of the forming pulse to the predetermined memory cell, (i) the control circuit adjusts the current amount of the load current supplied from the current source to a predetermined current amount that causes the sense amplification circuit to output the second logical value, and (ii) after the adjustment, the control circuit (ii-1) controls the current source to supply the load current having the predetermined current amount, and (ii-2) controls the writing unit to keep applying the forming pulse to the predetermined memory cell until the sense amplification circuit outputs the first logical value.

With the above structure, current driving performance of the current source is set high until an amount of a sneak current has been compensated before forming, and a forming determination is made on a selected memory cell based on the current driving performance. As a result, the forming determination becomes stable and stable forming can be achieved.

It is also possible that the sense amplification circuit includes a differential amplifier that (i) compares a voltage at the bit line selected by the bit line selector to a reference voltage, and (ii) outputs the second logical value when the voltage at the bit line selected by the bit line selector is higher than the reference voltage, and outputs the first logical value when the voltage is lower than the reference voltage.

It is further possible that the current source selectively switches the load current to be supplied, between a first load current and a second load current that has a more current amount than a current amount of the first load current, and the sense amplification circuit outputs the second logical value whichever the load current supplied from the current source is the first load current or the second load current, before the application of the forming pulse to the predetermined memory cell, when the predetermined memory cell is selected in a state where forming has not been performed on all the memory cells in the crosspoint memory cell array, and outputs (i) the first logical value if the load current supplied from the current source is the first load current and (ii) the second logical value if the load current is the second load current, before the application of the forming pulse to the predetermined memory cell, when the predetermined memory cell is selected in a state where forming has been performed on all the memory cells except the predetermined memory cell in the crosspoint memory cell array.

It is still further possible that the current source includes a Metal Oxide Semiconductor (MOS) transistor, the crosspoint nonvolatile memory device further includes a variable voltage source which is connected to a gate terminal of the MOS transistor and which selectively switches a voltage among voltages having different voltage values and applies the voltage to the gate terminal, the current source selectively switches the load current to be supplied, among at least the first load current, the second load current, and a third load current having a current amount that is more than the current amount of the first load current and less than the current amount of the second load current, and (i) when the current source is to supply the second load current, the control circuit adjusts a value of the voltage applied from the variable voltage source to cause an output current of the MOS transistor to be more than an output current of the MOS transistor in a case where the current source supplies the third load current, and (ii) when the current source is to supply the third load current, the control circuit adjusts the value of the voltage to cause the output current of the MOS transistor to be more than an output current of the MOS transistor in a case where the current source supplies the first load current.

It is still further possible that the variable resistance element is reversibly changed between the first resistance state and the second resistance state, by receiving voltages having different polarities.

It is still further possible that each of the memory cells includes the variable resistance element and a diode element which are connected in series with each other, the diode element comprising nitrogen-deficient silicon nitride.

In accordance with another aspect of the present invention, there is provided a forming method used in a crosspoint nonvolatile memory device, the crosspoint nonvolatile memory device including: a plurality of word lines parallel to each other on a first plane; a plurality of bit lines parallel to each other on a second plane parallel to the first plane, the bit lines three-dimensionally crossing the word lines; a crosspoint memory cell array in which memory cells are arrayed in rows and columns, the memory cells being arranged at respective three-dimensional crosspoints between the word lines and the bit lines, and each of the memory cells including a variable resistance element that is reversibly changed between a first resistance state and a second resistance state that has a higher resistance value than a resistance value of the first resistance state, when receiving an electrical signal; a word line selector that selects a world line from the word lines; a bit line selector that selects a bit line from the bit lines; a writing circuit that applies a forming pulse for forming to a predetermined memory cell among the memory cells, the predetermined memory cell being selected by selecting the bit line by the bit line selector and selecting the word line by the word line selector; and a sense amplification circuit electrically connected to the bit line, wherein, in an initial state after manufacturing the variable resistance element, the variable resistance element is in a third resistance state that has a higher resistance value than the resistance value of the second resistance state, and after forming is performed, a resistance state of the variable resistance element is changed from the initial state to a state where the resistance state is reversibly changeable between the first resistance state and the second resistance state, and the sense amplification circuit includes a current source that selectively switches a load current among load currents having different current amounts and supplies the load current to the bit line selected by the bit line selector, and the sense amplification circuit outputting a first logical value when a current amount of the load current flowing into the bit line selected by the bit line selector is more than a reference current amount, and outputting a second logical value when the current amount is less than the reference current amount, the forming method applied on the predetermined memory cell, the forming method including: adjusting the current amount of the load current supplied from the current source to a predetermined current amount that causes the sense amplification circuit to output the second logical value, before the application of the forming pulse to the predetermined memory cell, when the predetermined memory cell is selected; applying the forming pulse to the predetermined memory cell after the adjusting; and supplying the load current having the predetermined current amount from the current source after the applying, and reading a state of the predetermined memory cell by the sense amplification circuit, wherein in the supplying and the reading, when the sense amplification circuit outputs the first logical value, it is determined that the forming has been completed for the predetermined memory cell, and the forming on the predetermined memory cell is terminated, and when the sense amplification circuit outputs the second logical value, it is determined that the forming has not been completed for the predetermined memory cell, and the applying of the forming pulse is performed again.

According to the above aspect, it is possible to achieve stable forming.

It is also possible that in the supplying and the reading, when the sense amplification circuit outputs the first logical value, the predetermined memory cell is changed to be in the second resistance state.

According to the above aspect, it is possible to suppress the increase of a sneak current. As a result, the number of executions for the adjusting of the current amount is further decreased, thereby shortening a time required for the forming.

It is further possible that an address designating the predetermined memory cell is at least one of: an address indicating that an address designating the word line is switched to another; and an address indicating that an address designating the bit line is switched to another.

It is still further possible that the variable resistance element is reversibly changed between the first resistance state and the second resistance state, by receiving voltages having different polarities.

It is still further possible that each of the memory cells includes the variable resistance element and a diode element which are connected in series with each other, the diode element comprising nitrogen-deficient silicon nitride.

In accordance with still another aspect of the present invention, there is provided a forming method used in a crosspoint nonvolatile memory device, the crosspoint nonvolatile memory device including: a plurality of word lines parallel to each other on a first plane; a plurality of bit lines parallel to each other on a second plane parallel to the first plane, the bit lines three-dimensionally crossing the word lines; a crosspoint memory cell array in which memory cells are arrayed in rows and columns, the memory cells being arranged at respective three-dimensional crosspoints between the word lines and the bit lines, and each of the memory cells including a variable resistance element that is reversibly changed between a first resistance state and a second resistance state that has a higher resistance value than a resistance value of the first resistance state, when receiving an electrical signal; a word line selector that selects a world line from the word lines; a bit line selector that selects a bit line from the bit lines; and a writing circuit that applies a forming pulse for forming to a predetermined memory cell among the memory cells, the predetermined memory cell being selected by selecting the bit line by the bit line selector and selecting the word line by the word line selector, wherein, in an initial state after manufacturing the variable resistance element, the variable resistance element is in a third resistance state that has a higher resistance value than the resistance value of the second resistance state, and after forming is performed, a resistance state of the variable resistance element is changed from the initial state to a state where the resistance state is reversibly changeable between the first resistance state and the second resistance state, and the forming method includes: applying the forming pulse to the predetermined memory cell; and, after the applying, changing the resistance state of the predetermined memory cell to the second resistance state.

According to the above aspect, the selected memory cell for which forming has been performed is set to be in a high resistance state, thereby suppressing the increase of a sneak current. As a result, the forming determination becomes stable and therefore stable forming can be achieved.

These general and specific aspects may be implemented using a system, a method, an integrated circuit, a computer program, or a computer-readable recording medium such as a CD-ROM, or any combination of systems, methods, integrated circuits, computer programs, or computer-readable recording media.

Hereinafter, certain exemplary embodiments are described in greater detail with reference to the accompanying Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements. Furthermore, in the drawings, the elements that represent substantially identical structures, steps, and effects are assigned with the same reference numeral.

It should be noted in the description that the number of memory cells included in a memory cell array is schematically shown to make the principal easily understood, but the effects are not changed even if the number of memory cells is increased.

It should also be noted that the description is given only for a single-layered crosspoint cell array with reference to the drawings, but the present invention is not limited only to the single-layered crosspoint cell array. If the structure of the present invention is applied to each of single-layered crosspoint cell arrays included in a multi-layered crosspoint cell array, the same effects can be obtained.

(Embodiment 1)

[Structure of Crosspoint Nonvolatile Memory Device]

Figure 1A:
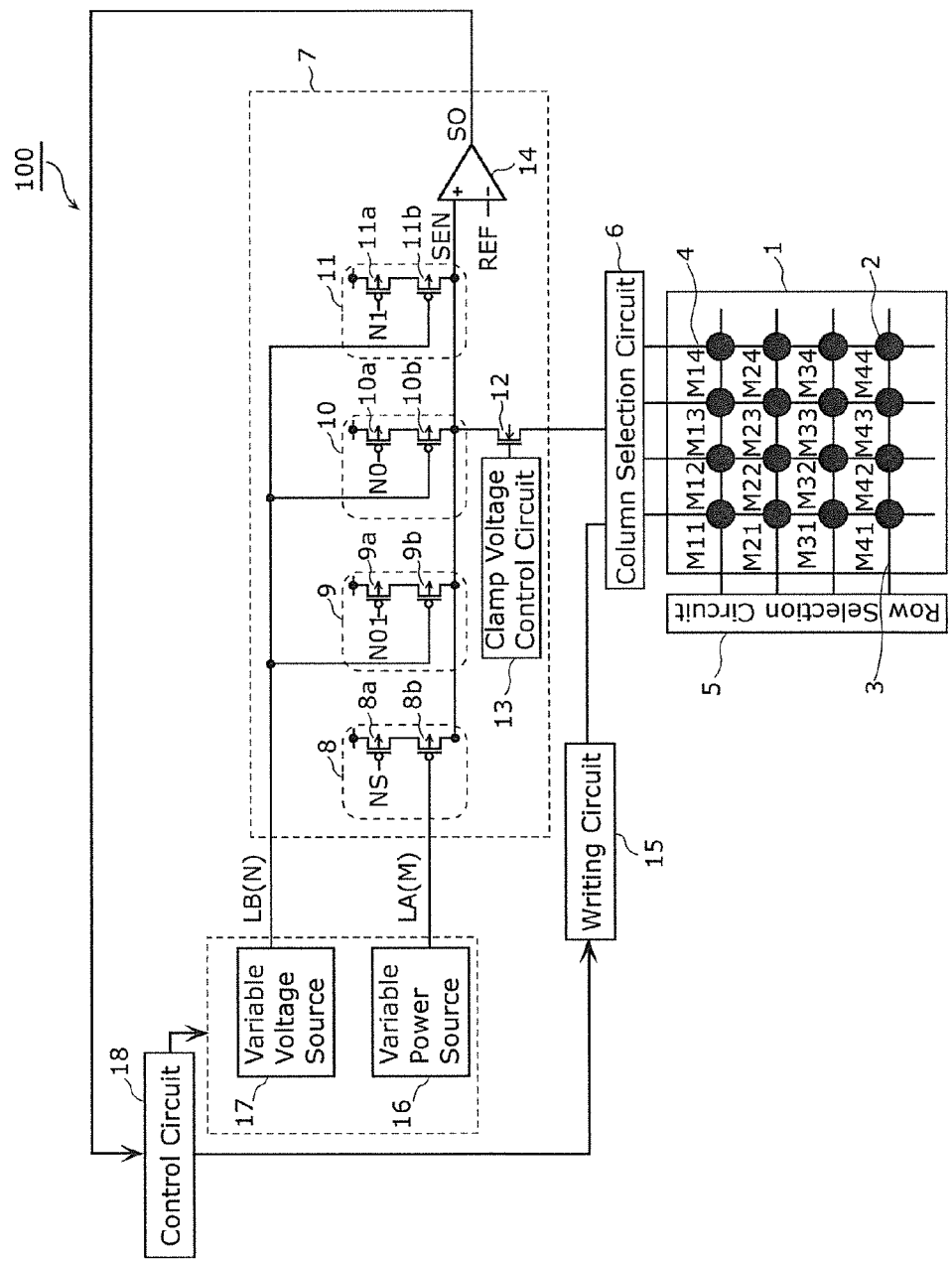
FIG. 1A is a circuit diagram showing a structure of a crosspoint nonvolatile memory device according to Embodiment 1.

FIG. 1A is a circuit diagram showing a structure of a crosspoint nonvolatile memory device 100 according to Embodiment 1.

The crosspoint nonvolatile memory device 100 includes: a plurality of word lines 3; a plurality of bit lines 4; a memory cell array (crosspoint memory cell array) 1; a row selection circuit 5; a column selection circuit 6; a writing circuit 15; sense amplification circuit (SA) 7; and a control circuit 18. The word lines 3 are arranged in parallel to one another on a first plane. The bit lines 4 are arranged in parallel to one another on a second plane parallel to the first plane. The bit lines 4 three-dimensionally cross the word lines 3. In the memory cell array (crosspoint memory cell array) 1, memory cells 2 are arranged in rows and columns. The memory cells 2 are provided at the respective three-dimensional crosspoints between the word lines 3 and the bit lines 4. Each of the memory cells 2 includes a variable resistance element. When receiving electrical signals, the variable resistance element is reversibly changed between a first resistance state (low resistance state) and a second resistance state (high resistance state) that has a higher resistance value than a resistance value of the first resistance state. The row selection circuit 5 is a word line selector that selects one of the word lines 3. The column selection circuit 6 is a bit line selector that selects one of the bit lines 4. The writing circuit 15 applies a forming pulse for forming (forming electrical signal) to a predetermined memory cell 2 selected by selecting a bit line 4 by the row selection circuit 5 and a word line 3 by the column selection circuit 6. The sense amplification circuit (SA) 7 is electrically connected to the bit lines 4 via the column selection circuit 6. The control circuit 18 controls the sense amplification circuit 7 and the writing circuit 15.

In an initial state after manufacturing the variable resistance element, the variable resistance element is in a third resistance state (super high resistance state) having a higher resistance value than a resistance value of the second resistance state. When forming is performed, a resistance state of the variable resistance element changes from the initial state to a state where the resistance state is reversibly changeable between the first resistance state and the second resistance state.

The sense amplification circuit 7 has a sneak current compensating load current supply unit 8. The sneak current compensating load current supply unit 8 is a current source that selectively switches a load current among load currents having different current amounts and supplies the load current to the bit line 4 selected by the column selection circuit 6. If a current amount of the load current flowing into the bit line 4 selected by the column selection circuit 6 is greater than a reference current amount, the sense amplification circuit 7 outputs 'L' level as a first logical value. On the other hand, if the current amount is less than the reference current amount, then the sense amplification circuit 7 outputs 'H' level as a second logical value.

When a predetermined memory cell 2 is selected, before application of a forming pulse to the predetermined memory cell 2, the control circuit 18 adjusts a current amount of the load current supplied from the sneak current compensating load current supply unit 8 to a predetermined current amount that causes the sense amplification circuit 7 to output 'H' level. After the adjustment, the control circuit 18 controls the sneak current compensating load current supply unit 8 to supply the load current having the predetermined current amount, and controls the writing circuit 15 to keep applying the forming pulse to the predetermined memory cell 2 until the sense amplification circuit 7 outputs 'L' level.

Here, the sense amplification circuit 7 includes a differential amplifier 14. The differential amplifier 14 compares a voltage at the bit line 4 selected by the column selection circuit 6 to a voltage as a reference (reference voltage REF). If the voltage at the bit line 4 selected by the column selection circuit 6 is higher than the reference voltage, the differential amplifier 14 outputs 'H' level. On the other hand, if the voltage at the bit line 4 selected by the column selection circuit 6 is lower than the reference voltage, the differential amplifier 14 outputs 'L' level.

The sneak current compensating load current supply unit 8 selectively switches the load current between a first load current and a second load current that has a more current amount than a current amount of the first load current, and supplies the load current to the selected bit line 4. Furthermore, the sense amplification circuit 7 outputs (i) 'L' level if the load current supplied from the sneak current compensating load current supply unit 8 is the first load current, and (ii) 'H' level if the load current is the second load current, before the application of the forming pulse to the predetermined memory cell 2, when the predetermined memory cell 2 is selected in the state where forming has been performed on all the memory cells 2 except the predetermined memory cell 2 in the memory cell array 1.

The sneak current compensating load current supply unit 8 further includes a P-type Metal Oxide Semiconductor (MOS) transistor 8b. The crosspoint nonvolatile memory device 100 further includes a variable voltage source 16. The variable voltage source 16 is connected to a gate terminal of the P-type MOS transistor 8b. The variable voltage source 16 selectively switches a voltage among voltages having different voltage values and applies the voltage to the gate terminal. The sneak current compensating load current supply unit 8 selectively switches the load current to be supplied, among the first load current, the second load current, and the third load current. A current amount of the third load current is more than the current amount of the first load current and less than the current amount of the second load current.

The control circuit 18 adjusts the voltage value of the variable voltage source 16. More specifically, when the sneak current compensating load current supply unit 8 is to supply the second load current, the control circuit 18 adjusts a value of the voltage applied from the variable voltage source 16 to cause an output current of the P-type MOS transistor 8b to be more than that in the case where the sneak current compensating load current supply unit 8 supplies the third load current. When the sneak current compensating load current supply unit 8 is to supply the third load current, the control circuit 18 adjusts the value of the voltage applied from the variable voltage source 16 to cause the output current of the P-type MOS transistor 8b to be more than that in the case where the sneak current compensating load current supply unit 8 supplies the first load current.

Furthermore, the variable resistance element comprises, for example, a tantalum oxide. Therefore, by receiving voltages having different polarities, the resistance state is reversibly changed between the first resistance state and the second resistance state.

The memory cell 2 includes a variable resistance element and a diode element which are connected in series with each other. The diode element comprises nitrogen-deficient silicon nitride.

The following describes the crosspoint nonvolatile memory device 100 according to the present embodiment in more detail.

The crosspoint nonvolatile memory device 100 includes the memory cell array 1, the row selection circuit 5, the column selection circuit 6, the sense amplification circuit 7, the writing circuit 15, the variable voltage sources 16 and 17, and the control circuit 18.

In the memory cell array 1, memory cells 2 are arranged in rows and columns. The memory cells 2 are arranged at respective crosspoints between the word lines 3 and the bit lines 4.

In FIG. 1A, the memory cell array 1 is shown simply as a 4×4 array. Matrix symbols M11 to M44 represent respective arrangement positions of the memory cells 2. Hereinafter, even if the matrix symbols are not assigned to the memory cell array 1 in the corresponding figure, the description is given with reference to the matrix symbols in FIG. 1A.

The row selection circuit 5 selects and controls one of the plurality of word lines 3. The column selection circuit 6 selects and controls one of the plurality of bit lines 4.

According to a current amount flowing in a bit line selected by the column selection circuit 6, the sense amplification circuit 7 outputs data "1" or data "0" that is a logical value, as a determination signal SO. In the sense amplification circuit 7, the sneak current compensating load current supply unit 8, a reading current detection load current supply unit 9, a data "0" verification load current supply unit 10, and a data "1" verification load current supply unit 11 are connected in parallel. These four load current supply units are connected to the column selection circuit 6 via a clamp N-type MOS transistor (bit line clamp transistor) 12. They are also connected to one of input terminals of the differential amplifier 14.

The sneak current compensating load current supply unit 8 is a current source that supplies a current having a variable output amount. In the sneak current compensating load current supply unit 8, a P-type MOS transistor 8a and a P-type MOS transistor 8b are connected in series with each other. The sneak current compensating load current supply unit 8 is connected to a drain of the clamp N-type MOS transistor 12. To a gate of the P-type MOS transistor 8a, a selection signal NS is supplied. The selection signal NS indicates whether or not to select the sneak current compensating load current supply unit 8. On the other hand, to a gate of the P-type MOS transistor 8b, a load current control voltage LA(M), where M is a natural number, is supplied. A voltage value of the load current control voltage LA(M) can adjust a current output amount of the sneak current compensating load current supply unit 8.

The reading current detection load current supply unit 9 is a current source that supplies a current having a variable output amount. In the reading current detection load current supply unit 9, a P-type MOS transistor 9a and a P-type MOS transistor 9b are connected in series with each other. The reading current detection load current supply unit 9 is connected to a drain of the clamp N-type MOS transistor 12. To a gate of the P-type MOS transistor 9a, a selection signal NO1 is supplied. The selection signal NO1 indicates whether or not to select the reading current detection load current supply unit 9. On the other hand, to a gate of the P-type MOS transistor 9b, a load current control voltage LB(N), where N is a natural number, is supplied. A voltage value of the load current control voltage LB(N) can adjust an current output amount of the reading current detection load current supply unit 9.

The data "0" verification load current supply unit 10 is a current source that supplies a current having a variable output amount. In the data "0" verification load current supply unit 10, a P-type MOS transistor 10a and a P-type MOS transistor 10b are connected in series with each other. The data "0" verification load current supply unit 10 is connected to a drain of the clamp N-type MOS transistor 12. To a gate of the P-type MOS transistor 10a, a selection signal N0 is supplied. The selection signal N0 indicates whether or not to select the data "0" verification load current supply unit 10. On the other hand, to a gate of the P-type MOS transistor 10b, a load current control voltage LB(N) is supplied. A voltage value of the load current control voltage LB(N) can adjust an current output amount of the data "0" verification load current supply unit 10.

The data "1" verification load current supply unit 11 is a current source that supplies a current having a variable output amount. In the data "1" verification load current supply unit 11, a P-type MOS transistor 11a and a P-type MOS transistor 11b are connected in series with each other. The data "1" verification load current supply unit 11 is connected to a drain of the clamp N-type MOS transistor 12. To a gate of the P-type MOS transistor 11a, a selection signal N1 is supplied. The selection signal N1 indicates whether or not to select the data "1" verification load current supply unit 11. On the other hand, to a gate of the P-type MOS transistor 11b, a load current control voltage LB(N) is supplied. A voltage value of the load current control voltage LB(N) can adjust an current output amount of the data "1" verification load current supply unit 11.

An output of the clamp voltage control circuit 13 is connected to a gate of the clamp N-type MOS transistor 12. The clamp voltage control circuit 13 has a function of setting a voltage at a bit line selected by the column selection circuit 6 to be lower than a predetermined voltage when reading data The differential amplifier 14 has two input terminals. The first input of the differential amplifier 14 is a contact point SEN between the four load current supply units and the clamp N-type MOS transistor 12. The second input of the differential amplifier 14 is the reference voltage REF that is set to a predetermined voltage. The output of the differential amplifier 14 is SO. The output SO of the differential amplifier 14 is an output of the sense amplification circuit 7.

The writing circuit 15 is connected to the column selection circuit 6, and supplies a writing pulse when reading data.

The variable voltage source 16 outputs a predetermined load current control voltage LA(M) indicated by the control circuit 18.

The variable voltage source 17 outputs a predetermined load current control voltage LB(M) indicated by the control circuit 18.

The control circuit 18 controls the variable voltage sources 16 and 17 based on the output SO of the differential amplifier 14, and performs selection instruction for output voltage.

Figure 1B:
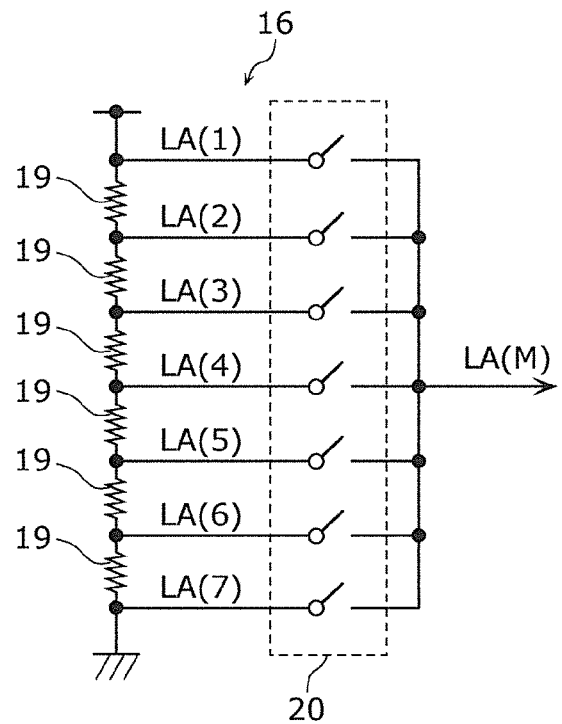
FIG. 1B is a circuit diagram showing a structure of a variable voltage source of the crosspoint nonvolatile memory device according to Embodiment 1.
Figure 1C:
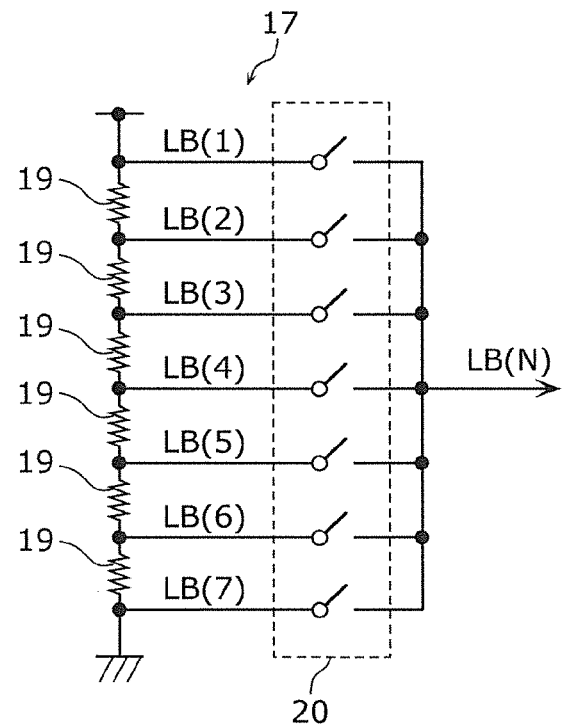
FIG. 1C is a circuit diagram showing a structure of a variable voltage source of the crosspoint nonvolatile memory device according to Embodiment 1.

FIG. 1B is a circuit diagram showing an example of the structure of the variable voltage source 16. FIG. 1C is a circuit diagram showing an example of the structure of the variable voltage source 17.

As shown in FIG. 1B, the variable voltage source 16 has a structure in which six fixed resistance elements 19 are connected in series between a power source unit and a grand unit. The variable voltage source 16 causes a load current control voltage selection switch 20 to select one of contact points LA(1), LA(2), LA(3), LA(4), LA(5), LA(6), and LA(7), and outputs the selected contact point as the load current control voltage LA(M).

As shown in FIG. 1C, the variable voltage source 17 has a structure in which six fixed resistance elements 19 are connected in series between the power source unit and the grand unit. The variable voltage source 17 causes the load current control voltage selection switch 20 to select one of contact points LB(1), LB(2), LB(3), LB(4), LB(5), LB(6), and LB(7), and outputs the selected contact point as the load current control voltage LB(M).

It should be noted that it has been described that each of the variable voltage sources 16 and 17 includes the fixed resistance elements 19 connected in series with one another to supply equally divided voltages, but it is also possible that each of the variable voltage sources 16 and 17 weights the divided voltages to be supplied. Furthermore, the fixed resistance elements 19 may be replaced by transistors. In addition, each of the variable voltage sources 16 and 17 may have a structure of other known variable voltage supply means.

Figure 2A:
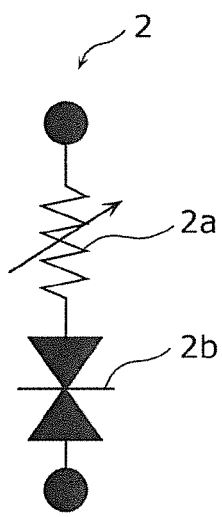
FIG. 2A is a circuit diagram showing a structure of a memory cell according to Embodiment 1.

FIG. 2A is a circuit diagram showing a structure of each of the memory cells 2.

In the memory cell 2, a variable resistance element 2a is connected in series with a diode element 2b.

Figure 2B:
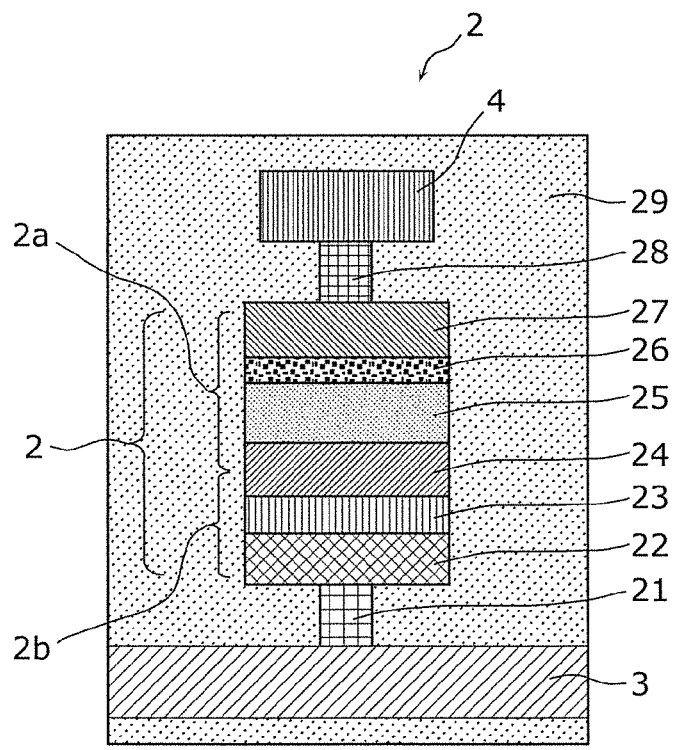
FIG. 2B is a cross-sectional view of the memory cell according to Embodiment 1.

FIG. 2B is a cross-sectional view of an example of the memory cell 2.

The memory cell 2 has a multi-layered structure having the variable resistance element 2a and the diode element 2b.

The diode element 2b has a MSM structure where a semiconductor layer 23 is provided between a first electrode 22 and a second electrode 24. The second electrode 24 of the diode element 2b serves also as a lower electrode of the variable resistance element 2a. On the second electrode 24 as the lower electrode, the variable resistance element 2a has a low concentration oxygen layer 25, a high concentration oxygen layer 26, and a third electrode 27 as an upper electrode. The variable resistance element 2a and the diode element 2b are covered with an insulation layer 29.

The first electrode 22 is connected to a word line 3 via a first via 21, while the third electrode 27 is connected to the bit line 4 via a second via 28.

The semiconductor layer 23 comprises nitrogen-deficient silicon nitride ($SiN_x$). Here, the nitrogen-deficient silicon nitride refers to silicon nitride having a nitride content atomic percentage that is lower than that of $Si_3N_4$ which is silicon nitride of stoichiometric composition. The nitrogen-deficient silicon nitride serves as a semiconductor.

Each of the first electrode 22 and the second electrode 24 may comprise TaN (tantalum nitride), TiN (titanium nitride), or W (tungsten). Here, each of the first electrode 22 and the second electrode 24 is TaN having a thickness of 50 nm.

The third electrode 27 may comprise Pt (platinum), Ir (iridium), Pd (palladium) or an alloy of these materials. Here, the third electrode 27 is Ir having a thickness of 50 nm.

Each of the low concentration oxygen layer 25 and the high concentration oxygen layer 26 serves as a variable resistance layer. The resistance of the variable resistance element 2a is changed when the resistance of the variable resistance layer is changed.

The low concentration oxygen layer 25 includes an oxygen-deficient film that is an oxide having a lower oxygen content atomic percentage in comparison to that of an oxide having stoichiometric composition. Here, the low concentration oxygen layer 25 comprises a tantalum oxide. In the case of tantalum, the most stable oxide of stoichiometric composition is $Ta_2O_5$, a preferable composition range of the low concentration oxygen layer 25 is $TaO_x$ (0<x<2.5), and a thickness ranges from 30 nm to 100 nm. A preferable composition range of the high concentration oxygen layer 26 is $TaO_y$, (x<y), and a thickness ranges from 1 nm to 10 nm. Furthermore, by adjusting a flow ratio of an oxygen gas to an argon gas in sputtering, it is possible to adjust a value of x in the chemical formula of $TaO_x$ and a value of y in the chemical formula of $TaO_y$.

It should be noted that the structure of the memory cell is not limited to the structure shown in FIG. 2B, but may be any other structure as long as the equivalent circuit in FIG. 2 can be obtained.

Figure 2C:
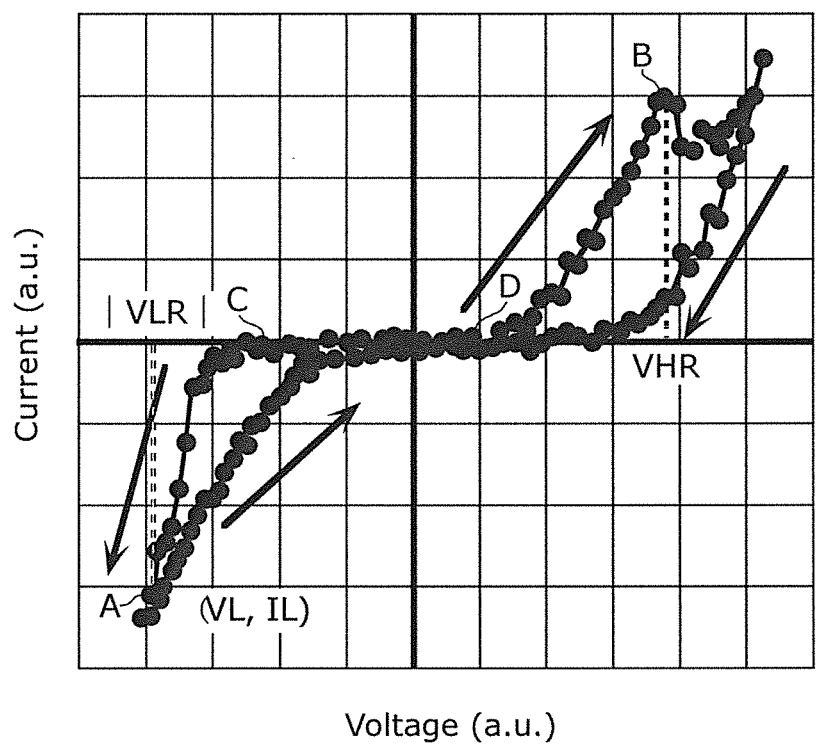
FIG. 2C is a graph plotting IV characteristics regarding resistance changes of the memory cell according to Embodiment 1.

FIG. 2C shows a VI curve of resistance changes of the memory cell 2.

In FIG. 2C, a voltage direction where a word line 3 has a higher voltage than that of a bit line 4 is a negative voltage side, while a voltage direction where a bit line 4 has a higher voltage than that of a word line 3 is a positive voltage side. Then, in a negative voltage region between point C and point A, the memory cell 2 changes from a high resistance state to a low resistance state. On the other hand, in a positive voltage region from D to point B or more, the memory cell 2 bi-directionally changes between the low resistance state and the high resistance state. In other words, application of a negative voltage for low resistance writing (LR writing) changes the resistance state of the memory cell 2 from the high resistance state to the low resistance state, while application of a positive voltage for high resistance writing (HR writing) changes the resistance state of the memory cell 2 from the low resistance state to the high resistance state. It should be noted that an off region where a current hardly flows, which is seen between point C and point D, results from non-linear characteristics of the diode element 2b.

[Forming Characteristics of Variable Resistance Element]

Meanwhile, the reversible resistance change shown in FIG. 2C can be started when an operation called forming is performed on the memory cell 2 after manufacturing. For example, an example of the forming operation disclosed in Patent Literature 2 is described below.

Figure 3A:
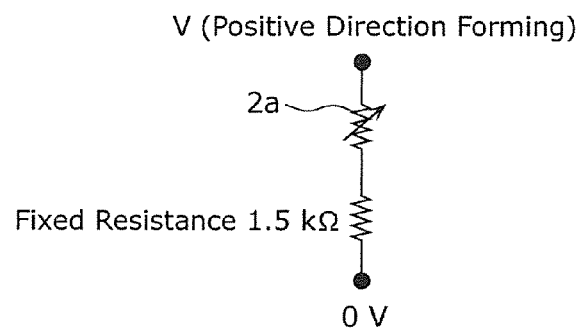
FIG. 3A is a circuit diagram showing a structure of an evaluation element according to Embodiment 1.

FIG. 3A is a circuit diagram showing a structure of an evaluation element used in measurement.

In the evaluation element shown in FIG. 3A, the variable resistance element 2a having the same structure as shown in FIG. 2B is connected in series with a fixed resistance element of 1.5 kΩ.

Figure 3B:
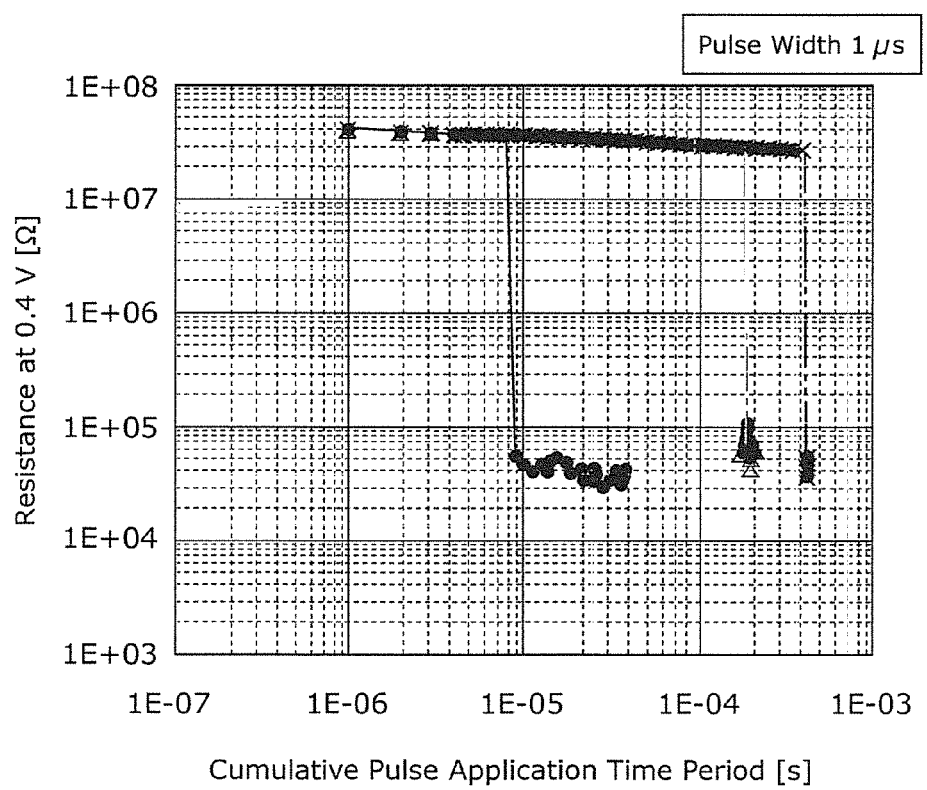
FIG. 3B is a graph plotting, for each of three evaluation elements, transition of a resistance value when a forming pulse is applied to the target evaluation element according to Embodiment 1.

FIG. 3B is a graph plotting transition of resistance values of three evaluation elements each as shown in FIG. 3A when a forming pulse is applied to the three evaluation elements. In FIG. 3B, a relationship between a resistance value of the variable resistance element 2a and a cumulative pulse application time of the forming pulse when forming is tried by applying a forming positive voltage pulse (pulse width=1 μs) is plotted.

As shown in FIG. 3B, the cumulative pulse application time varies depending on the evaluation elements, but the resistance state of each of the evaluation elements is suddenly lowered from a super high resistance state of tens of MΩ to a high resistance state of tens of kΩ. The lowered resistance state corresponds to the state where forming has been completed. The evaluation results show that the pulse application counts required for forming completion depend on the variable resistance elements. However, if forming is terminated when the state where a resistance value is significantly lowered from an initial state is detected, it is possible to avoid waste and to perform good forming.

[Forming Method of Crosspoint Nonvolatile Memory Device]

The following describes a forming method used in the crosspoint nonvolatile memory device 100 including the variable resistance elements having the forming characteristics as seen in FIG. 3B.

Figure 4:
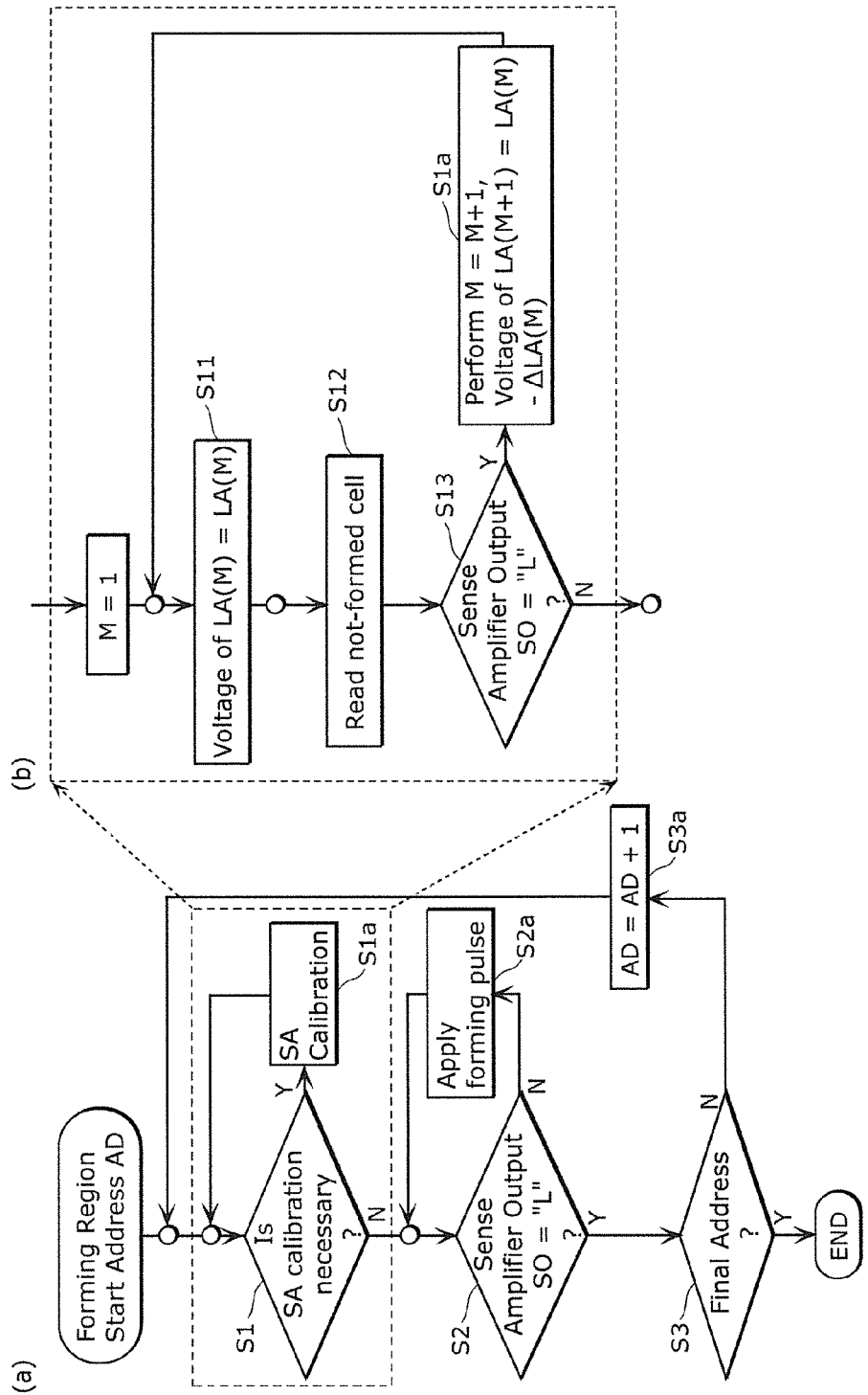
FIG. 4 is a flowchart of forming according to Embodiment 1.

FIG. 4 (a) is a flowchart of steps in the forming.

The forming method performed on a predetermined memory cell 2 includes the first step (Steps S1 and S1a), the second step (Step S2a), and the third step (Step S2). At the first step (Steps S1 and S1a), if the predetermined memory cell 2 is selected, prior to applying a forming pulse to the predetermined memory cell 2, a current amount of a load current of the sneak current compensating load current supply unit 8 is adjusted to a predetermined current amount, thereby causing an output of the sense amplification circuit 7 to be 'H' level. Then, ft the second step (Step S2a), the forming pulse is applied to the predetermined memory cell 2. At the third step (Step S2), the sneak current compensating load current supply unit 8 is controlled to supply a load current having a predetermined current amount, thereby causing the sense amplification circuit 7 to read the state of the predetermined memory cell 2.

At the third step, if the output of the sense amplification circuit 7 is 'L' level (Y at Step S2), then it is determined that the forming on the predetermined memory cell 2 has been completed, and the forming is therefore ended. On the other hand, if the output of the sense amplification circuit 7 is 'H' level (N at Step S2), then it is determined that the forming on the predetermined memory cell 2 has not been completed, and the second step is therefore repeated.

The following describes the forming method used in the crosspoint nonvolatile memory device 100 according to the present embodiment in more detail.

First, a forming region is determined, and then a beginning address is designated.

Then, the sense amplification circuit 7 reads information of a memory cell 2 which is designated by the beginning address and to which a forming pulse has not yet been applied. The sense amplification circuit 7 examines the readout information (makes a sense amplification calibration determination).

According to the determination results of the sense amplification circuit 7, it is determined whether or not sense amplification calibration (SA calibration) of the sense amplification circuit 7 is necessary (Step S1).

If it is determined that the sense amplification calibration is necessary (Y at Step S1), then a current output amount of a current flowing from the SA calibration, namely, the sense amplification circuit 7, to the memory cell array 1 is changed (Step S1a) and the SA calibration determination is made again (Step S1). Then, until it is determined that the SA calibration is not necessary, or until the predetermined number of SA calibration executions have been performed, the above processing is repeated.

Next, the sense amplification circuit 7 reads information of the memory cell 2 having the designated beginning address. Then, a branch determination is made according to a result of the output SO of the sense amplification circuit 7 in order to determine whether or not the memory cell 2 to which a forming pulse is applied is in the state where the resistance state of the memory cell 2 is reversibly changeable (Step S2). More specifically, after supplying, to the memory cell array 1, a current having a current output amount which is determined based on the SA calibration determination, it is determined whether or not the output SO of the sense amplification circuit 7 changes from 'H' level to 'L' level.

If the output SO of the sense amplification circuit 7 is 'L' level (Y at Step S2), then it is determined that the memory cell 2 having the designated beginning address is in the state where reversible resistance change is possible, in other words, in a resistance state lower than a predetermined resistance state, and therefore the application of the forming pulse is terminated and the processing proceeds to the next processing. On the other hand, if the output SO of the sense amplification circuit 7 is 'H' level (N at Step S2), then it is determined that the designated memory cell 2 is in a resistance state higher than the predetermined resistance state, and therefore a forming pulse is applied to the designated memory cell 2 (Step S2a). Then, until the output of the sense amplification circuit 7 reaches 'L' level, or until the predetermined number of forming pulse application executions have been performed, the above processing is repeated.

Next, it is determined whether or not the beginning address indicating the memory cell 2 for which Step S2 has been performed is a final address in the forming region (Step S3). If the beginning address indicating the memory cell 2 is not a final address (N at Step S3), then the processing proceeds to a next address (Step S3a), and the same processing is performed from Step S1. On the other hand, if the beginning address indicating the memory cell 2 is a final address (Y at Step S3), the forming is terminated.

FIG. 4 (b) is a flowchart showing details of the SA calibration determination at Step S1 and the SA calibration at Step S1a. The description is given with reference to the sense amplification circuit 7 shown in FIGS. 1A and 1B.

First, as M=1, to a gate of the P-type MOS transistor 8b of the sneak current compensating load current supply unit 8, a start voltage LA(1) is applied (Step S11). Here, it is desirable that a driving current of the P-type MOS transistor 8b is small enough while the start voltage LA(1) is applying. In the present embodiment, the start voltage LA(1) is assumed to be equal to a voltage of the power source.

Here, NS that is an input signal of the gate of the P-type MOS transistor 8a is set to 'L' level corresponding to the selection state of the sneak current compensating load current supply unit 8. On the other hand, selection signals N01, N0, and N1 for controlling selection/non-selection of the reading current detection load current supply unit 9, the data "0" verification load current supply unit 10, and the data "1" verification load current supply unit 11, respectively, are set to the 'H' level indicating non-selection.

Next, in the above situation, the sense amplification circuit 7 reads information of a memory cell 2 which is designated by a beginning address and for which forming has not yet been performed (Step S12). More specifically, a level of the output SO of the sense amplification circuit 7 is read out.

Next, it is determined whether or not the output SO of the sense amplification circuit 7 is 'L' level (Step S13). If the output SO is the 'L' level (Y at Step S13), the level means that a current flowing in the memory cell array 1 is relatively more than a driving current of the P-type MOS transistor 8b, and it is therefore determined that SA calibration is necessary. In other words, it is determined that, since an amount of the current flowing into the memory cell array 1 is greater than the reference current amount, a voltage at the memory cell array 1 does not reach the reference voltage REF, and SA calibration is therefore necessary.

Here, the reference voltage REF is considered, for example, as a voltage generated when a current having a reference current amount flows in the memory cell array 1, in the state where all the memory cells 2 in the memory cell array is in the resistance state between an initial state (super high resistance state) and a high resistance state.

If it is determined that SA calibration is necessary, an M value is incremented, and a voltage LA(2) is applied to the gate of the P-type MOS transistor 8b (Step S1a), and the sense amplification circuit 7 reads information of the memory cell 2 again (Step S12). Then, an M value is further added until the output SO of the sense amplification circuit 7 is determines as 'H' level, or the same processing is repeated until the predetermined number of SA calibration executions have been performed.

A voltage LA(M+1), which is designated by incrementing the M value, corresponds to a voltage obtained by lowering the voltage LA(M) by a difference voltage ΔLA(M). Furthermore, regarding a voltage in the maximum voltage state (voltage LA(7) in the present embodiment), in the state where forming has been performed on all the memory cells 2 except a single memory cell 2, it is necessary to set the voltage in the maximum voltage state to have a voltage value that causes the output SO of the sense amplification circuit 7 to 'H' level. However, it is not always necessary to associate the maximum value with this state. For example, it is also possible that the voltage LA(6) is associated with this state in consideration of variations and allowance.

If the output SO of the sense amplification circuit 7 is 'H' level (N at Step S13), the level means that a current flowing in the memory cell array 1 is relatively less than the driving current of the P-type MOS transistor 8b, and it is therefore determined that SA calibration is not necessary. In other words, it is determined that, since an amount of the current flowing into the memory cell array 1 is less than the reference current amount and a voltage at the memory cell array 1 reaches the reference voltage REF, the SA calibration is not necessary. In this case, when a good forming determination is made on a memory cell 2 for which forming has not yet been performed and a voltage at the memory cell array 1 is lowered, the sense amplification circuit 7 becomes in the state where a level of the output SO is changeable to 'H' level.

Next, with reference to a figure, the steps of the forming and the steps of the sense amplification calibration are described in more detail.

Figure 5:
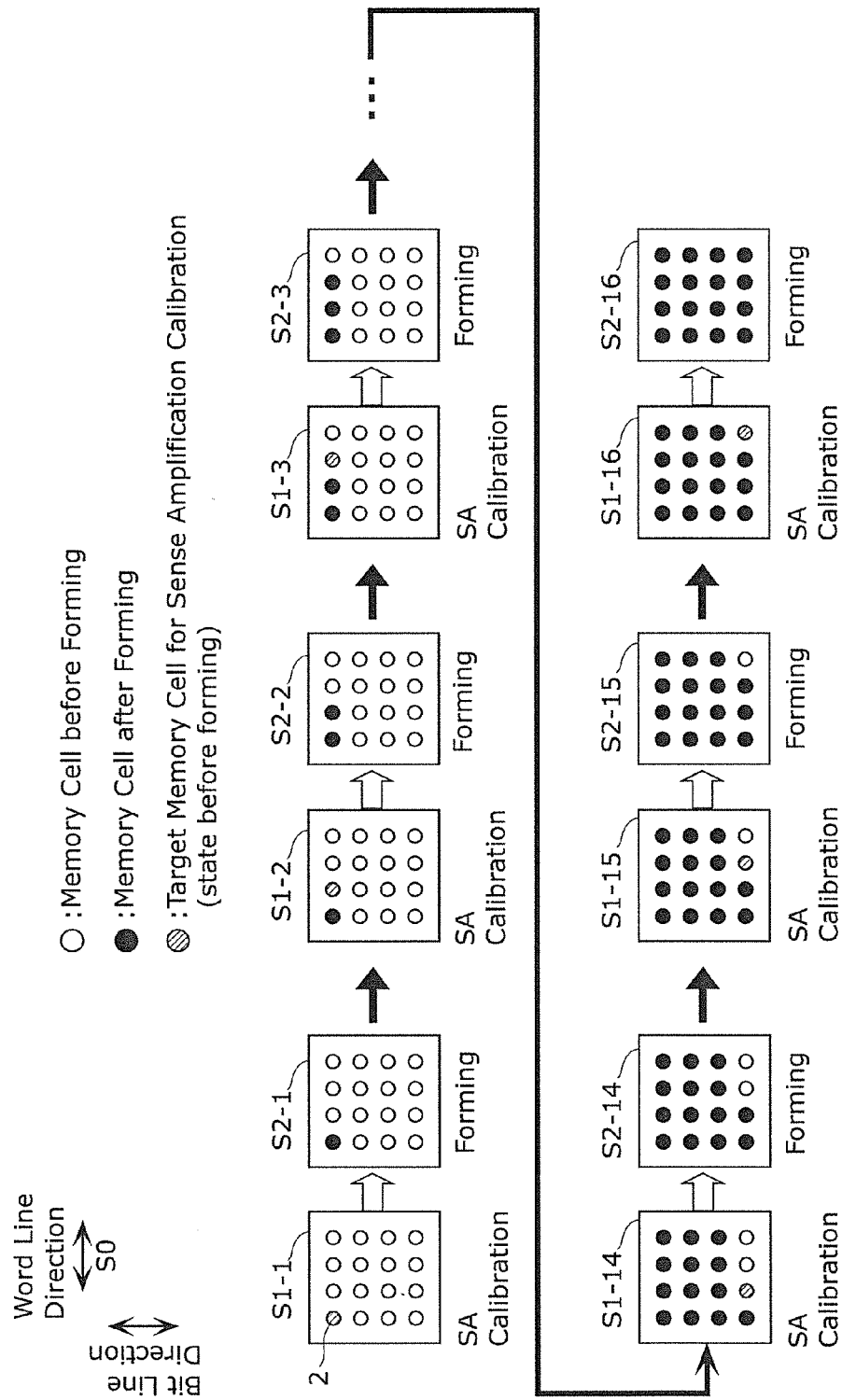
FIG. 5 is a diagram showing a forming process of a 4×4 memory cell array according to Embodiment 1.

FIG. 5 is a diagram showing a forming process for the 4×4 memory cell array 1 which has been explained with reference to FIG. 1A.

It should be noted that FIG. 5 shows the memory cell array 1 in FIG. 1. In FIG. 5, a vertical direction is a bit line direction and a horizontal direction is a word line direction. Furthermore, although not shown in the figure, arrangement positions of the memory cells 2 in FIG. 5 correspond to the arrangement positions M11 to M44 in the memory cell array 1 in FIG. 1A. In addition, in FIG. 5, white circles show memory cells 2 for which forming has not yet been performed (non-forming state), black circles show memory cells 2 for which forming has been performed (forming state), and hushed white circles show memory cells 2 which are selected to be applied with sense amplification calibration.

First, a memory cell M11 among memory cells 2 for which forming has not been performed is set as the first target memory cell (selected memory cell). Then, sense amplification calibration is performed on the memory cell M11 to determine a current output amount of a current to flow from the sense amplification circuit 7 to the memory cell array 1 (Step S1-1). The current output amount is for determining whether or not the target memory cell M11 is in the state where the resistance is reversibly changeable.

Subsequently, after applying a forming pulse to the memory cell M11, the sense amplification circuit 7, for which the sense amplification calibration has been performed at Step S1-1, examines appropriateness of the forming on the memory cell M11 (Step S2-1).

Next, a memory cell M12 is set as a target memory cell from which data is to be read. Sense amplification calibration is performed on the memory cell M12 to determine a current output amount of a current to flow from the sense amplification circuit 7 to the memory cell array 1 (Step S1-2). The current output amount is for determining whether or not the target memory cell M12 is in the state where the resistance is reversibly changeable.

Subsequently, after applying a forming pulse to the memory cell M12, the sense amplification circuit 7, for which the sense amplification calibration has been performed at Step S1-2, examines appropriateness of the forming on the memory cell M12 (Step S2-2).

After that, in the same manner as described above, sense amplification calibration is performed on each target memory cell 2 (Steps S1-3 to S1-16), and the steps for forming on the memory cell 2 are repeated for each target memory cell 2 (Step S2-3 to S2-16). As a result, forming has been completed.

Next, a processing principle allowing stable forming is described with reference to the forming flow of FIG. 5.

Figure 6:
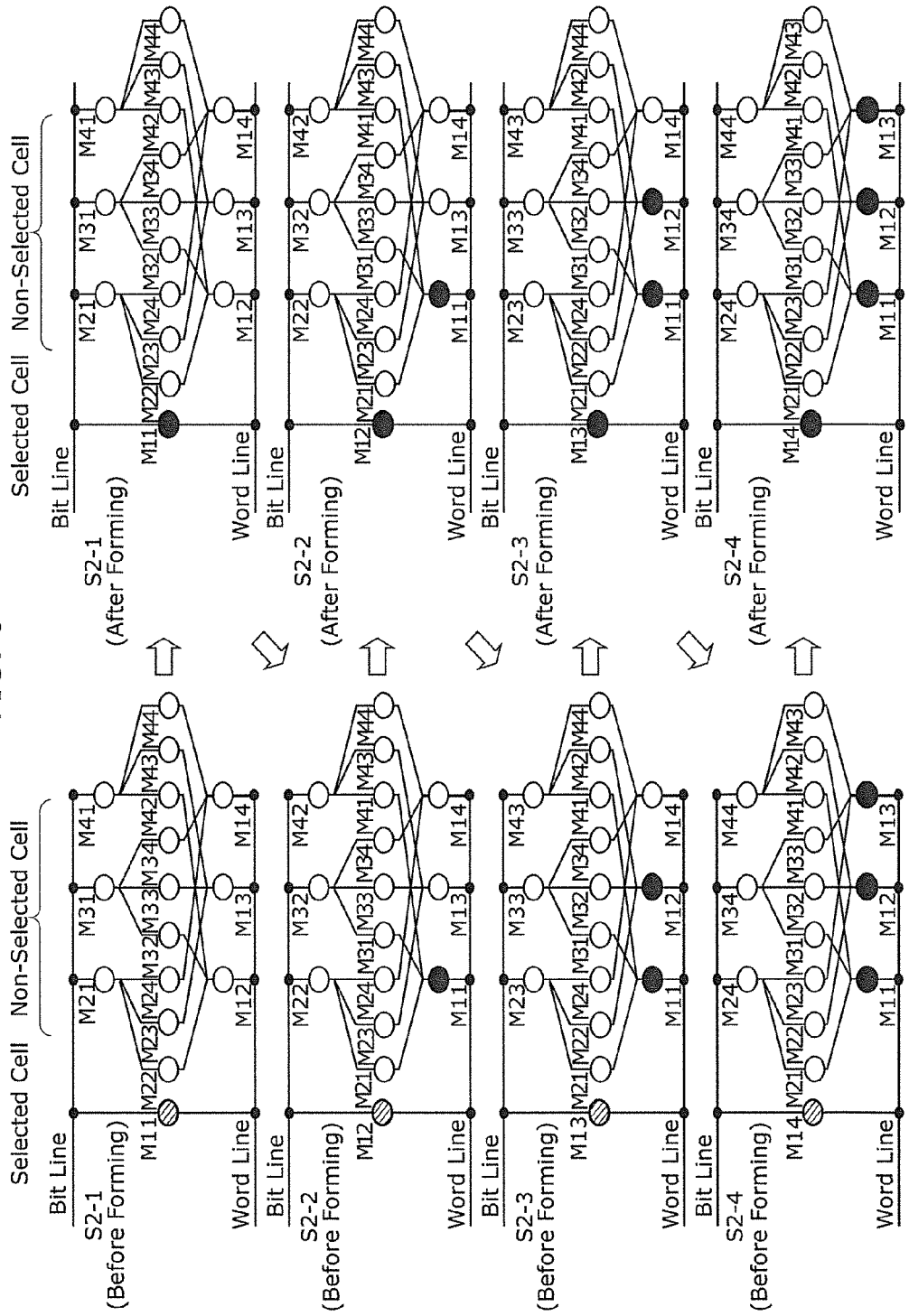
FIG. 6 is a diagram showing how an equivalent circuit schematic of a memory cell array changes as forming progresses, according to Embodiment 1.
Figure 7:
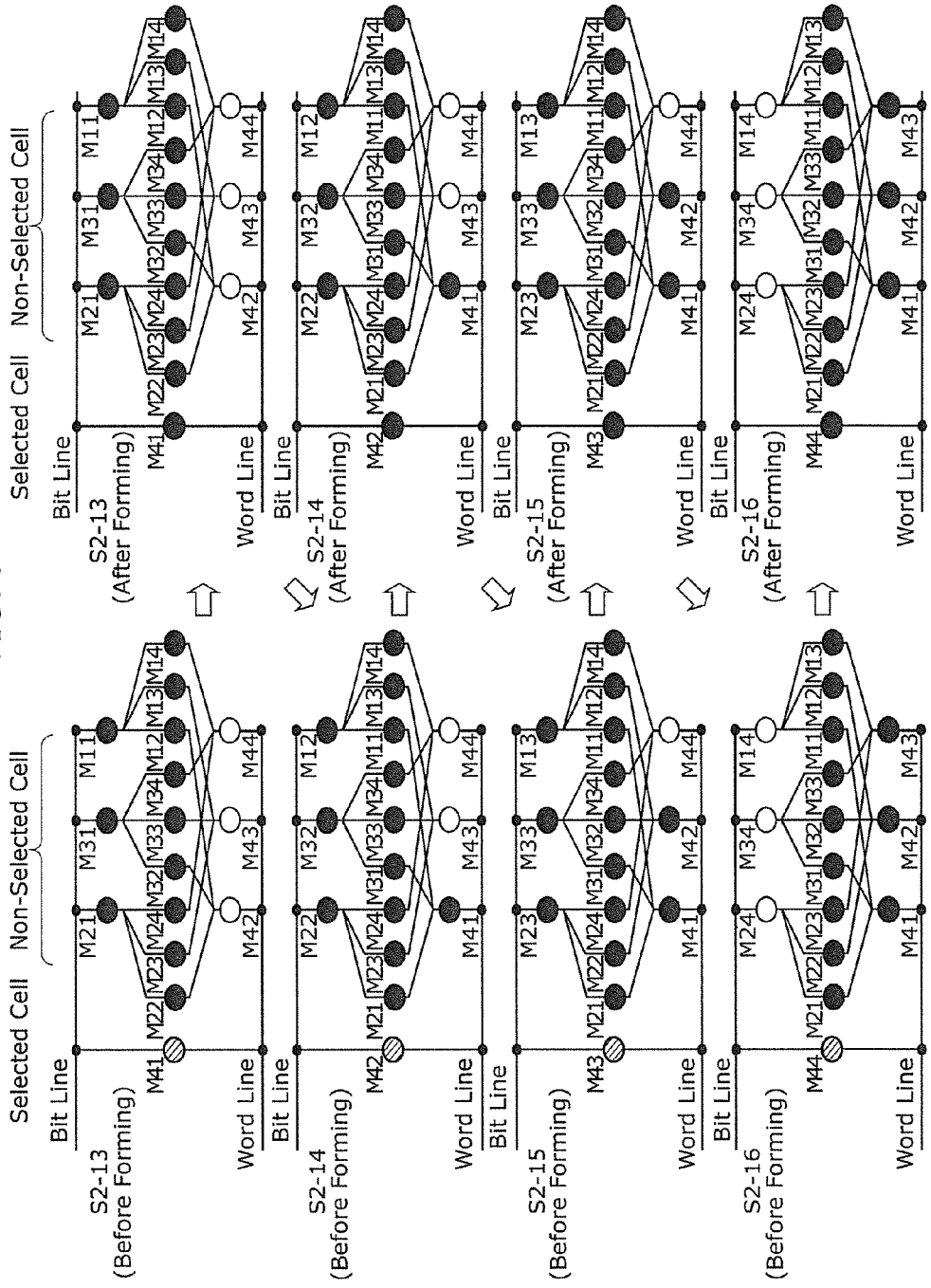
FIG. 7 is a diagram showing how an equivalent circuit schematic of the memory cell array changes as forming progresses, according to Embodiment 1.

Each of FIGS. 6 and 7 is a diagram showing how an equivalent circuit schematic of the memory cell array 1 is changed as forming progresses (as the number of memory cells 2 for which forming has been performed is increased).

Each of FIGS. 6 and 7 shows states of selected memory cells before forming (memory cells for which sense amplification calibration is to be executed and then the forming is to be performed) on the left side, and states of the selected memory cells after the forming on the right side.

FIG. 6 shows a connection relationship between a memory cell 2 before forming and the memory cell 2 after the forming, at Steps S2-1 to S2-4 in the forming flow described with reference to FIG. 5. Likewise, FIG. 7 shows a connection relationship between a memory cell 2 before forming and the memory cell 2 after the forming, at Steps S2-13 to S2-16 in the final stage of the forming flow in FIG. 5.

In addition, in FIGS. 6 and 7, white circles show memory cells 2 for which forming has not yet been performed (non-forming state), black circles show memory cells after forming (forming state), and hushed white circles show memory cells 2 which are selected to be applied with sense amplification calibration.

First, an equivalent circuit of the memory cell array 1 is described with reference to, for example, the circuit diagram in which forming has not yet performed on any of the memory cells 2 at S2-1 in FIG. 6.

Reading, writing, and forming in the memory cell array 1 are performed by giving a predetermined voltage difference between a selected bit line and a selected word line, and applying a predetermined voltage at both ends of a selected memory cell at a crosspoint of the lines. In the case of S2-1 in FIG. 6, the selected memory cell is a memory cell M11, and the memory cell M11 is designated by the selected bit line and the selected word line.

Meanwhile, in a crosspoint nonvolatile memory device, in addition to a current path via a selected memory cell, there is a current path via non-selected memory cells except the selected memory cell, in other words, a sneak current path.

Here, one terminal of a non-selected memory cell M21, which is on the selected bit line connected to the selected memory cell M11, is connected to the selected bit line. The other terminal of the non-selected memory cell M21 is connected to a non-selected word line, and connected to one terminal of each of non-selected memory cells M22, M23, and M24 on the non-selected word line. The other terminal of each of the non-selected memory cells M22, M23, and M24 is connected to each non-selected bit line, and to the other terminal of each of non-selected selected memory cells M12, M13, and M14 on the non-selected bit line. The other terminal of each of the non-selected memory cells M12, M13, and M14 is connected to the selected word line. Therefore, a current path is formed to connect the selected bit line to the selected word line via the non-selected memory cells M21, M22, M23, M24, M12, M13, and M14.

Likewise, one terminal of a non-selected memory cell M31, which is on the selected bit line connected to the selected memory cell M11, is connected to the selection bit line. The other terminal of the non-selected memory cell M31 is connected to the non-selected word line, and to one terminal of each of non-selected memory cells M32, M33, and M34 on the non-selected word line. The other terminal of each of the non-selected selected memory cells M32, M33, and M34 is connected to each non-selected bit line, and to the other terminal of each of the non-selected memory cells M12, M13, and M14 on the non-selected bit line. The other terminal of each of the non-selected memory cells M12, M13, and M14 is connected to the selected word line. Therefore, a current path is formed to connect the selected bit line to the selected word line via the non-selected memory cells M31, M32, M33, M34, M12, M13, and M14.

Likewise, one terminal of a non-selected memory cell M41, which is on the selected bit line connected to the selected memory cell M11, is connected to the selection bit line. The other terminal of the non-selected memory cell M41 is connected to the non-selected word line, and to one terminal of each of non-selected memory cells M42, M43, and M44 on the non-selected word line. The other terminal of each of the non-selected memory cells M42, M43, and M44 is connected to each non-selected bit line, and to the other terminal of each of the non-selected memory cells M12, M13, and M14 on the non-selected bit line. The other terminal of each of the non-selected memory cells M12, M13, and M14 is connected to the selected word line. Therefore, a current path is formed to connect the selected bit line to the selected word line via the non-selected memory cells M41, M42, M43, M44, M12, M13, and M14.

As described above, a sneak current path via non-selected memory cells is expressed as a path having three stages connected in series. The three stages are: non-selected memory cells on a selected bit line (the three non-selected memory cells at S2-1 in FIG. 6); non-selected memory cells on a selected word line (the three non-selected memory cells at S2-1 in FIG. 6); and non-selected memory cells in the number equal to products of memory cells between the above two stages (3×3=9 at S2-1 in FIG. 6). It is therefore understood that an amount of a sneak current depends on the states of the resistance values of the respective non-selected memory cells.

In the case of the memory cell array 1 in M rows and N columns, in the sneak current path including non-selected memory cells connected in series in three stages including the non-selected memory cells, the upper stage can be expressed by M−1 non-selected memory cells, the lower stage can be expressed by N−1 non-selected memory cells, and the intermediate stage can be expressed by (M−1)×(N−1) non-selected memory cells.

Next, how an amount of a sneak current is increased as forming progresses is described with reference to FIGS. 6 and 7.

At Step S2-1 in FIG. 6, forming has not yet been performed for any of the memory cells before forming on the memory cell M11. Before forming, a resistance value of a memory cell is in a very high resistance state where a sneak current hardly occurs.

Next, at Step S2-1, even after the forming on the memory cell M11, forming has not been performed on any of the memory cells except the selected memory cell M11, so that a sneak current hardly occurs.

Next, at Step S2-2, a target selected memory cell for forming is changed to the memory cell M12. At Step S2-2, before the forming on the memory cell M12, there is a sneak current path via the memory cell M11 for which the forming has been performed at Step S2-1. However, forming has not been performed on any of the non-selected memory cells M22, M32, and M42 at the first stage of the three serial stages of the sneak current path. Therefore, these non-selected memory cells block the sneak current path, so that the sneak current is hardly increased.

Next, at Step S2-2, even after the forming on the memory cell M12, the sneak current path is blocked at the first stage of the three serial stages of the sneak current path. As a result, the sneak current is hardly increased.

Next, at Steps S2-3 and S2-4, although the number of memory cells for which forming has been performed is gradually increased, the sneak current path is blocked at the first stage of the three serial stages of the sneak current path, and thereby the sneak current is hardly increased.

Next, at Steps S2-13 to S2-16, since the number of memory cells for which forming has been performed in the sneak current path is more than that at Step S2-1 or S2-4, the sneak current path is not blocked at the first stage of the three serial stages of the sneak current path.

Here, the sneak current is compared between the case where the number of memory cells for which forming has been performed is small the case where the number is large.

For example, at Step S2-1 in FIG. 6, forming has not been performed on the memory cells except the target memory cell M11. Therefore, the sneak current is the same between before and after the forming on the selected memory cell. Likewise, for example, also at Step S2-16 in FIG. 7, although the amount of the sneak current is increased to maximum, the amount of the sneak current is not different between before and after the forming on the selected memory cell. This means that the increase of the number of memory cells for which forming has been performed increases the amount of the sneak current, but the amount of the sneak current is not different between before and after the forming on the selected memory cell.

A bit line current IBL flowing from a selected bit line to a selected word line is expressed as a sum of Icell and Isneak (N), where Icell represents a current flowing into a selected memory cell, and Isneak(N) represents a total amount of sneak currents flowing via non-selected memory cells. Then, since the selected memory cell before forming is in a very high resistance state, a current flowing in a selected bit line when accessing the selected memory cell before the forming is expressed by the following Equation 1.

$$IBL(\text{before forming}) = I\text{sneak}(N) \quad \text{(Equation 1)}$$

On the other hand, after the forming, the target selected memory cell is changed to the state where a memory cell current Icell having an amount equal to or more than a predetermined amount flows. Therefore, a current flowing in the selected bit line when accessing the selected memory cell after the forming is expressed by the following Equation 2.

$$IBL(\text{after forming}) = I\text{cell} + I\text{sneak}(N) \quad \text{(Equation 2)}$$

Here, the sneak current Isneak(N) is changed depending on the number N of memory cells for which forming has been performed. However, the sneak current Isneak(N) is not different between before and after the forming on the selected memory cell. Therefore, according to Equation 1, it is possible to measure a sneak current by measuring a bit line current IBL (before forming) before forming on the target selected memory cell. Then, according to Equation 2, by setting the measured current amount as an offset component, it is determined whether or not a value that is obtained by subtracting the offset value from the bit line current IBL (after forming) after forming is equal to or more than a predetermined value, in other words, whether or not the amount of the memory cell current is increased enough. Based on the determination result, it is possible to determine whether or not the forming has been completed for the selected memory cell.

Figure 8A:
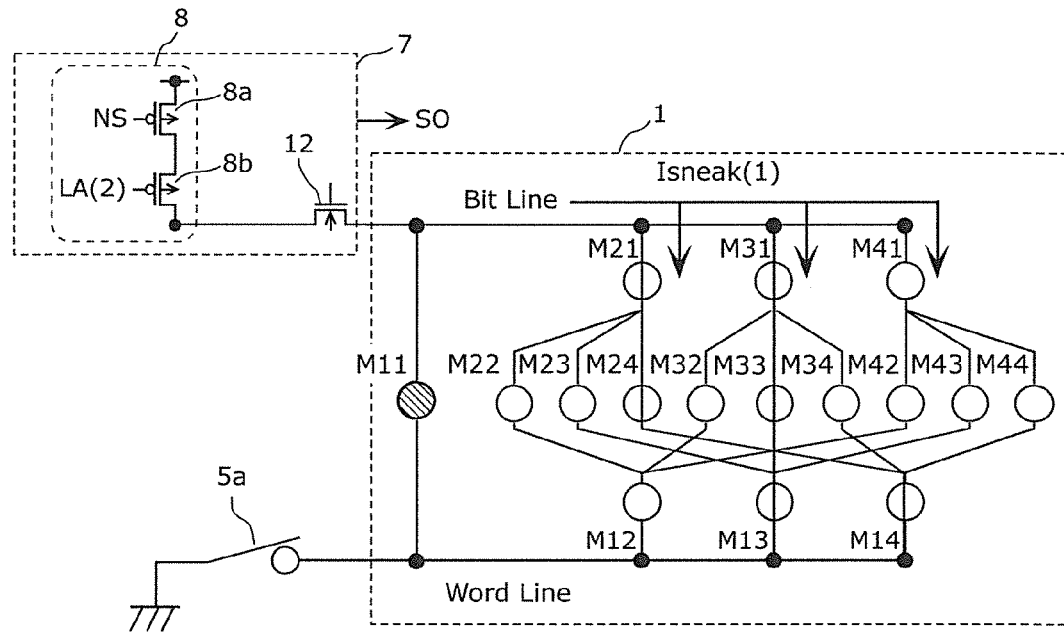
FIG. 8A is a diagram showing a circuit structure after sense amplifier calibration according to Embodiment 1.

FIG. 8A is a diagram showing a circuit structure after sense amplification calibration has been performed to examine forming on the memory cell M11 at Step S1-1 in FIG. 5. Here, in FIG. 8A, circuits unnecessary in the explanation are not shown.

In FIG. 8A, the sense amplification circuit 7 causes the sneak current compensating load current supply unit 8 to supply a current from to a selected bit line of the memory cell array 1 via a clamp N-type MOS transistor 12. Thereby, a current flows from a selected word line opposite to the selected memory cell M11 to the ground via a selection switch 5a in the row selection circuit 5. Here, various kinds of voltage values are sequentially applied to the gate of the P-type MOS transistor 8b of the sneak current compensating load current supply unit 8. Here, a load current control voltage LA(2) at the time when the sense amplification calibration is completed is shown. In other words, the figure shows a load current control voltage LA(M) that causes the output SO of the sense amplification circuit 7 to an level. Furthermore, to a gate N01 of a P-type MOS transistor 9a of the reading current detection load current supply unit 9, a gate N0 of a P-type MOS transistor 10a of the data "0" verification load current supply unit 10, a gate N1 of a P-type MOS transistor 11a of the data "1" verification load current supply unit 11, which are not shown, respective power source voltage levels are applied to turn these transistors OFF.

Here, the memory cell array 1 is in the state at Step S1-1 in FIG. 6, in other words, the state where forming has not been performed on any of the memory cells 2. Even in the state, a very small amount of a sneak current Isneak(1) flows, as the sneak current path, from the memory cells M21, M31, and M41 to the selected word line, in addition to the selected memory cell M11.

Figure 8B:
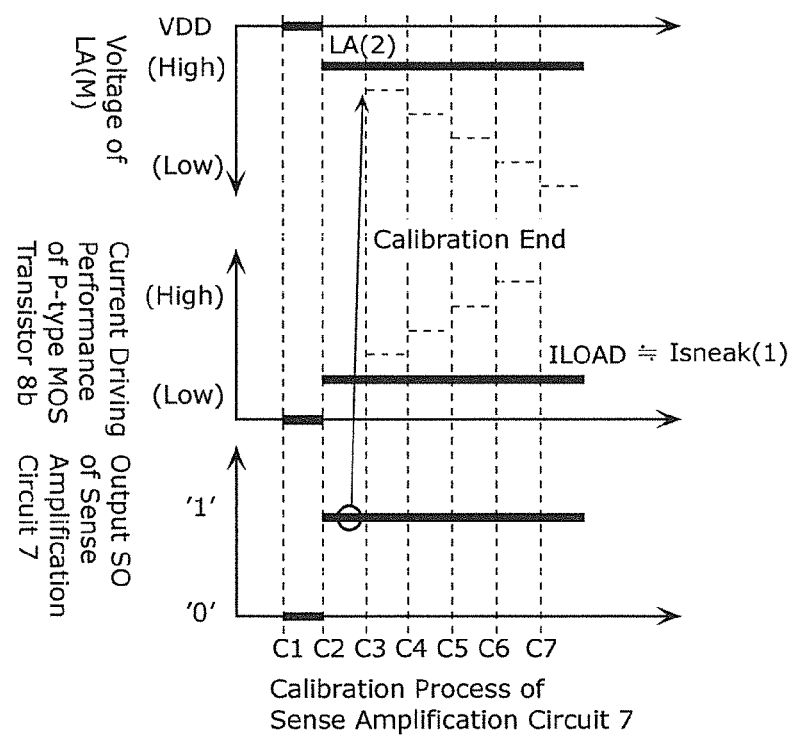
FIG. 8B is a time chart of sense amplifier calibration according to Embodiment 1.

The processing of the sense amplification calibration until the structure shown in FIG. 8A is obtained is described with reference to the time chart of FIG. 8B. Here, a horizontal axis in FIG. 8B expresses steps of the sense amplification calibration. FIG. 8B shows seven-stage steps from Step C1 to Step C7.

First, at Step C1, a power source voltage as a load current control voltage LA(1) is applied to a gate of the P-type MOS transistor 8b of the sneak current compensating load current supply unit 8. Here, the P-type MOS transistor 8b, which serves as a load transistor of the sense amplification circuit 7, is in an OFF state. A very small amount of the sneak current Isneak(1) flowing in the memory cell array 1 lowers a bit line voltage, and the output SO of the sense amplification circuit 7 is in 'L' level.

Next, at Step C2, a load current control voltage LA(2) is applied to a gate of the P-type MOS transistor 8b of the sneak current compensating load current supply unit 8, and a predetermined amount of a current drives the P-type MOS transistor 8b. Here, the P-type MOS transistor 8b, which serves as a load transistor of the sense amplification circuit 7, is driven by a current amount equal to or slightly more than the sneak current Isneak(1). Then, the lowering of a voltage of a bit line is prevented, and therefore the output SO of the sense amplification circuit 7 is in 'H' level. This state is the state where the current equivalent to the sneak current Isneak(1) is compensated. This state corresponds to the state where the sense amplification calibration has been completed.

Next, while the load current control voltage LA(2) is applied, a forming pulse is applied to the selected memory cell M11. It is thereby determined whether or not forming has been appropriately performed on the memory cell M11 as a selected memory cell. More specifically, it is determined whether or not the output SO of the sense amplification circuit 7 is in 'L' level. As described with reference to FIG. 6, the current Isneak(1) of the sneak current path is not different between before and after forming. Therefore, if the output SO of the sense amplification circuit 7 is changed to 'L' level, it means that the memory cell M11 is changed to a lower resistance state. As a result, it can be determined that forming has been completed for the memory cell M11. If the output SO of the sense amplification circuit 7 is still in 'H' level, it is determined that forming has not yet been completed for the memory cell M11 and then the forming pulse is applied once more to repeat the same step.

Figure 8C:
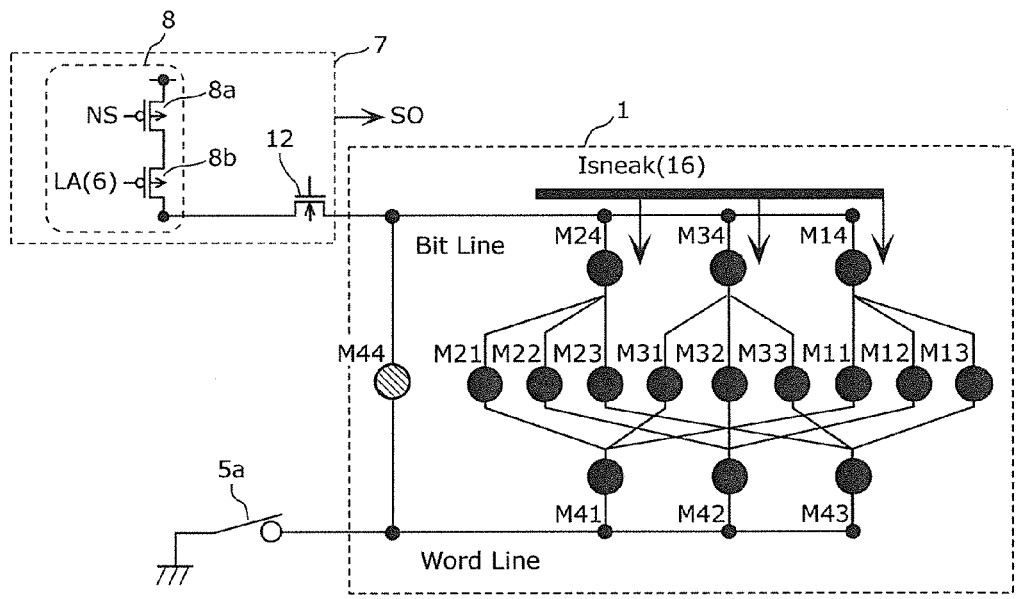
FIG. 8C is a diagram showing a circuit structure after sense amplifier calibration according to Embodiment 1.

FIG. 8C is a diagram showing a circuit structure after sense amplification calibration has been performed to examine forming on the memory cell M44 at Step S1-16 in FIG. 5.

In FIG. 8C, the sense amplification circuit 7 causes the sneak current compensating load current supply unit 8 to supply a current to a selected bit line of the memory cell array 1 via a clamp N-type MOS transistor 12. Thereby, a current flows from the selected word line opposite to the selected memory cell M44 to the ground via a selection switch 5a in the row selection circuit 5. Here, various kinds of voltage values are sequentially applied to the gate of the P-type MOS transistor 8b of the sneak current compensating load current supply unit 8. Here, a load current control voltage LA(6) at the time when the sense amplification calibration is completed is shown. In other words, the figure shows a load current control voltage LA(M) that causes the output SO of the sense amplification circuit 7 to 'H' level. Furthermore, to a gate N01 of a P-type MOS transistor 9a of the reading current detection load current supply unit 9, a gate N0 of a P-type MOS transistor 10a of the data "0" verification load current supply unit 10, a gate N1 of a P-type MOS transistor 11a of the data "1" verification load current supply unit 11, which are not shown, respective power source voltage levels are applied to turn these transistors OFF.

Here, the memory cell array 1 is in the state of S1-16 in FIG. 7, in other words, the state where forming has been performed on all the memory cells 2 except the memory cell M44. In this state, an amount of a sneak current Isneak(16), which is more than that in the case of FIG. 8A, flows, as the sneak current path, from the memory cells M14, M24, and M34 to the selected word line.

Figure 8D:
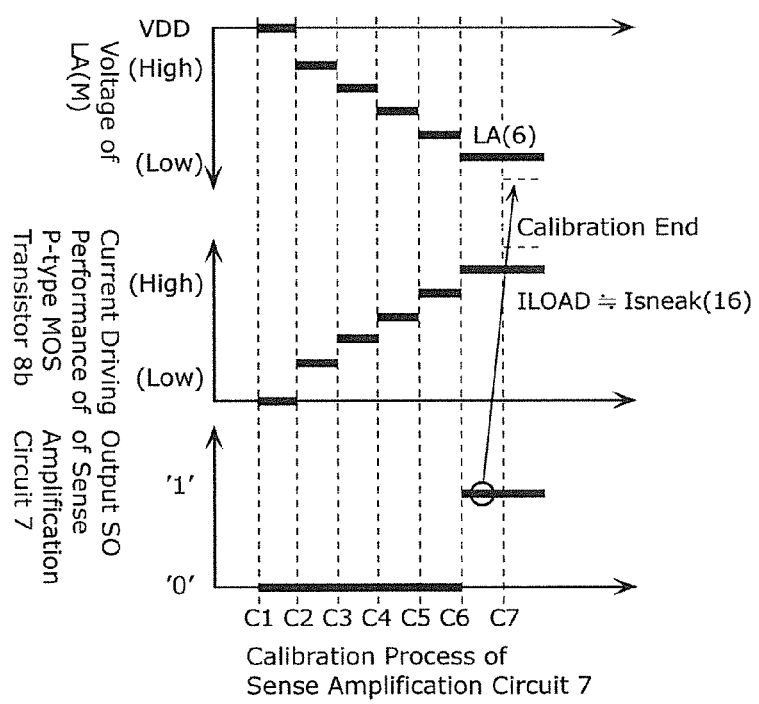
FIG. 8D is a time chart of sense amplifier calibration according to Embodiment 1.

The processing of the sense amplification calibration until the structure shown in FIG. 8C is obtained is described with reference to the time chart of FIG. 8D. Here, a horizontal axis of FIG. 8D expresses steps of the sense amplification calibration. FIG. 8D shows seven-stage steps from Step C1 to Step C7.

First, like the step in FIG. 8B, at Step C1, a power source voltage as a load current control voltage LA(1) is applied to the gate of the P-type MOS transistor 8b of the sneak current compensating load current supply unit 8. After that, the load current control voltage is gradually lowered to be applied.

Finally, at Step C6, a load current control voltage LA(6) is applied to the gate of the P-type MOS transistor 8b of the sneak current compensating load current supply unit 8, and a predetermined amount of a current drives the P-type MOS transistor 8b. Here, the P-type MOS transistor 8b, which serves as a load transistor of the sense amplification circuit 7, is driven by a current equal to or slightly greater than the sneak current Isneak(16). Then, the lowering of a voltage of a bit line is prevented, and therefore the output SO of the sense amplification circuit 7 is in 'H' level. This state is the state where a current equivalent to the sneak current Isneak(16) is compensated. This state corresponds to the state where the sense amplification calibration has been completed.

Next, while the load current control voltage LA(16) is applied, a forming pulse is applied to the memory cell M44. It is thereby determined whether or not forming has been appropriately performed on the memory cell M44 as a selected memory cell. More specifically, it is determined whether or not the output SO of the sense amplification circuit 7 is in an 'L' level. As described with reference to FIG. 7, the current Isneak(16) of the sneak current path is not different between before and after forming. Therefore, if the output SO of the sense amplification circuit 7 is changed to 'L' level, it means that the memory cell M44 is changed to a lower resistance state. As a result, it can be determined that forming has been completed for the memory cell M44. If the output SO of the sense amplification circuit 7 is still in 'H' level, it is determined that forming has not yet been completed for the memory cell M44 and then the forming pulse is applied once more to repeat the same step.

As described above, as the number of memory cells for which forming has been performed is increased, a value of a sneak current is increased. However, the value of the sneak current is not different between before and after forming on a selected memory cell. Therefore, if current driving performance is set high until an amount of the sneak current can be compensated before the forming, it is possible to stably detect slight low resistance writing in the selected memory cell due to the forming.

It should be noted that it has been described in the present embodiment that each of the sense amplification calibration and the forming is performed for each one bit of a target memory cell for the forming, but the sense amplification calibration may not be performed always for each one bit. For example, the sense amplifier calibration and the forming can be performed as shown in FIG. 9.

Figure 9:
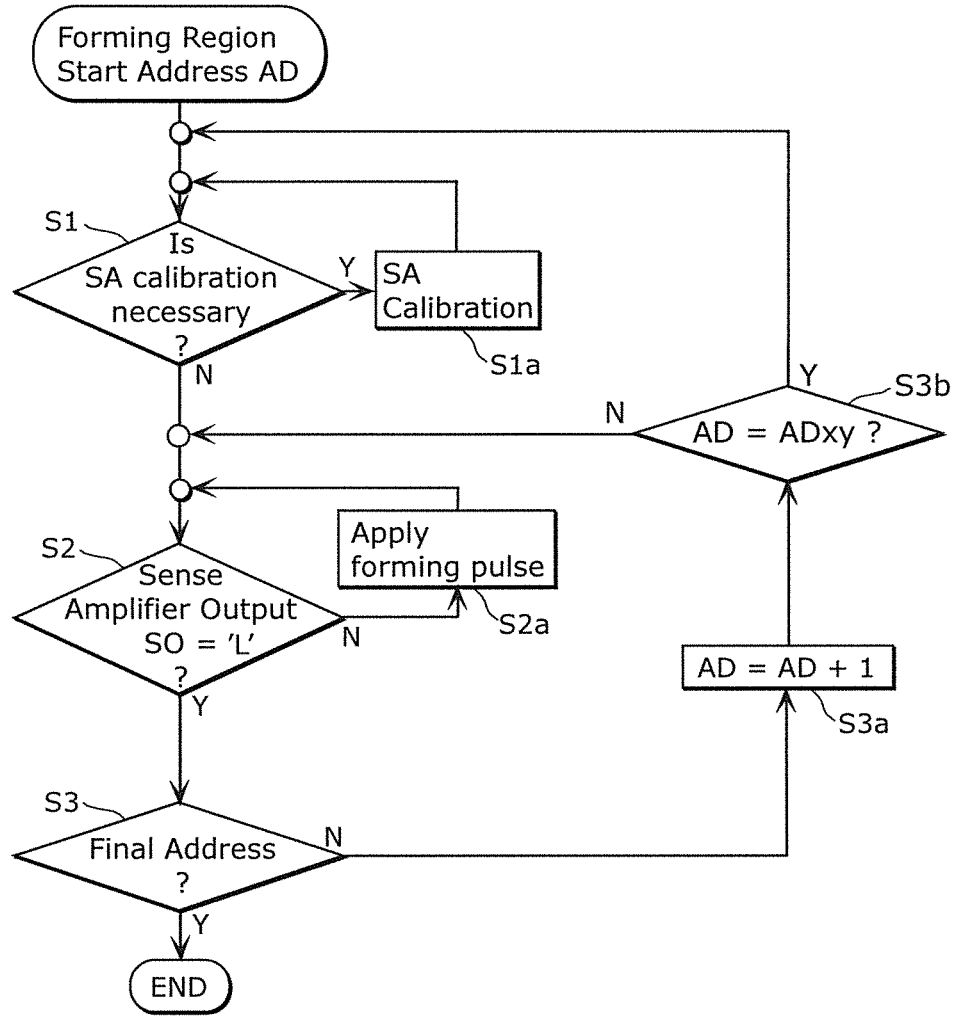
FIG. 9 is a flowchart of forming according to a variation of Embodiment 1.

FIG. 9 is a flowchart of a variation of the forming shown in (a) in FIG. 4.

In FIG. 9, it is determined whether or not an address of a next target memory cell for forming is ADxy (Step S3b). Thereby, at Step S1, sense amplification calibration is performed only when the address is the predetermined address ADxy, in other words, only in the case of forming on a predetermined memory cell. For forming on the other memory cells except the predetermined memory cell, a determination at Step S2 is made based on a current output of the sense amplification circuit 7 for which calibration has been performed in forming on another memory cell. This is because the increase of a sneak current caused by forming for one bit is very small. If sense amplification calibration is performed only for each of stages where a sneak current is increased by a predetermined amount, it is possible to reduce the number of sense amplification calibration executions and to shorten a time required for the sense amplification calibration executions.

In FIG. 9, the address ADxy that designates a predetermined memory cell may be at least one of: an address indicating memory cells M11, M21, M31, and M41, in other words, an address indicating that an address designating a word line is changed to another (address indicating memory cells 2 on the first column from the left of the memory cell array 1); an address indicating that an address designating a bit line is changed to another (address indicating memory cells 2 on the first row from the top of the memory cell array 1); and an address for each predetermined interval on a single word line. It should also be noted that the sense amplification calibration may be appropriately performed according to an increased amount in a sneak current, and a sensibility of the sense amplification circuit 7 or a determination current necessary to examine forming.

(Embodiment 2)

[Forming Method of Crosspoint Nonvolatile Memory Device]

A nonvolatile memory device according to Embodiment 2 has the same structure as that of the crosspoint nonvolatile memory device 100 according to Embodiment 1. However, the nonvolatile memory device according to Embodiment 2 differs from the crosspoint nonvolatile memory device 100 according to Embodiment 1 in the forming method. More specifically, Embodiment 2 differs from Embodiment 1 in that, at the third step of the forming method used in the crosspoint nonvolatile memory device 100 according to Embodiment 1, if the output of the sense amplification circuit 7 is in 'L' level (Y at Step S2), a predetermined memory cell 2 is changed to be in the second resistance state.

Figure 10:
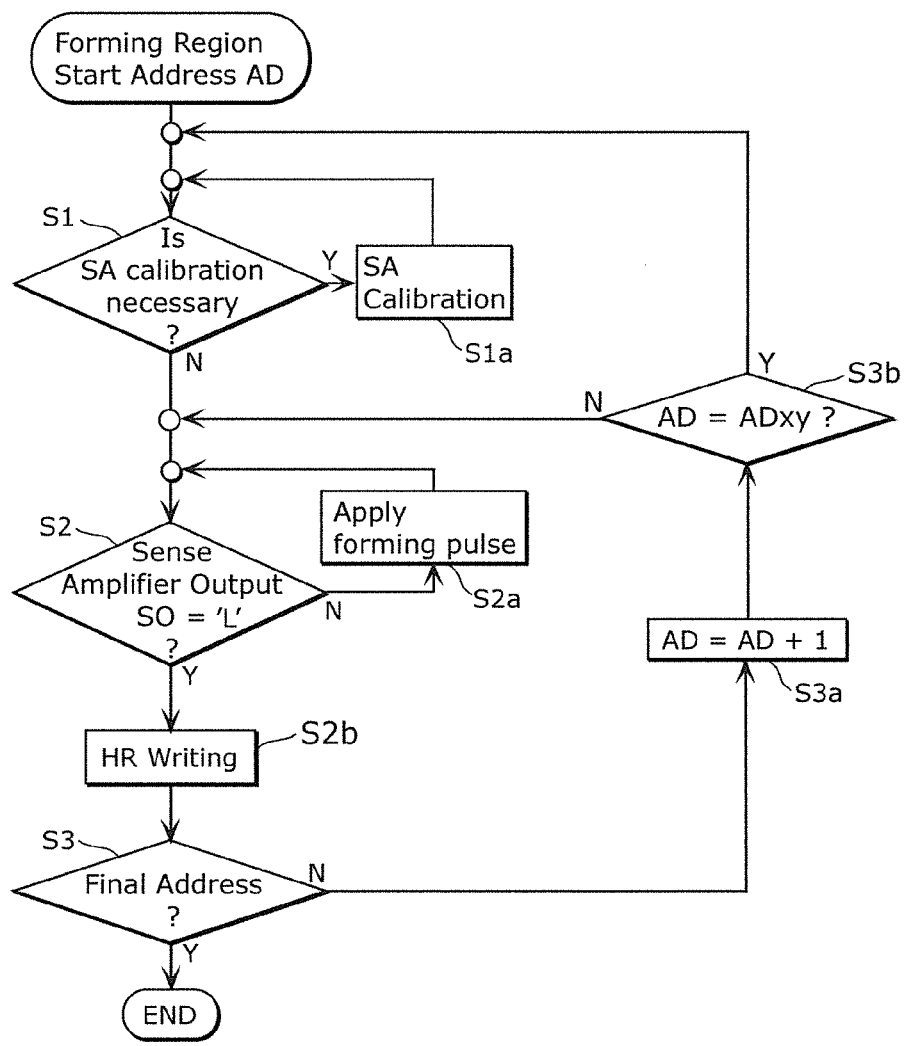
FIG. 10 is a flowchart of forming according to Embodiment 2.

FIG. 10 is a flowchart of the forming according to Embodiment 2.

The forming method on a predetermined memory cell 2 includes the first step (Step S2a) and the second step (Step S2b). At the first step (Step S2a), a forming pulse is applied to the predetermined memory cell 2. At the second step (Step S2b), after the first step, the predetermined memory cell 2 is changed to be in the second resistance state.

The forming in FIG. 10 differs from the forming in FIG. 9 according to Embodiment 1 in that, when, at Step 2, the output SO of the sense amplification circuit 7 is 'L' and it is determined that a selected memory cell designated by a target address is in the state where reversible resistance change is possible (Y at Step S2), then high resistance state writing (HR writing) is performed on the selected memory cell. More specifically, an HR writing voltage is applied to the selected memory cell for which forming has been performed, thereby changing the selected memory cell to be in a high resistance state.

An amount of a sneak current varies depending on resistance states of non-selected memory cells. Therefore, the forming according to the present embodiment can suppress the increase of the sneak current by setting the selected memory cell for which forming has been performed to be in a high resistance state. As a result, the number of sense amplification calibration executions is less than that in the forming in FIG. 9. Therefore, a time required for the sense amplification calibration executions can be shortened. In addition, at Step S2 in FIG. 10, the reduction of the sneak current allows the forming current (a voltage of a forming pulse) to be concentrated on the target selected memory cell for forming. As a result, it is possible to achieve high-speed and stable forming.

Thus, the crosspoint nonvolatile memory device and the forming method used in the device according to the present invention have been described with reference to the embodiments. However, the present invention is not limited to these embodiments. Those skilled in the art will be readily appreciated that various modifications of the embodiments are possible without materially departing from the novel teachings and advantages of the present disclosure. Accordingly, all such modifications are intended to be included within the scope of the present invention. Furthermore, those skilled in the art will be readily appreciated that combinations of the structural elements of the different embodiments are possible without materially departing from the novel teachings and advantages of the present invention.

For example, it has been described with reference to FIGS. 4, 9, and 10 that a forming pulse is applied to a selected memory cell 2 after it is determined whether or not the output SO of the sense amplification circuit 7 is changed from 'H' level to 'L' level. In short, it has been described that Step S2a is performed after Step S2. However, it is also possible that it is determined whether or not the output SO of the sense amplification circuit 7 is changed from 'H' level to 'L' level after a forming pulse is applied to a selected memory cell 2.

It is further possible in FIG. 10 that sense amplification calibration is not performed and a forming determination for a selected memory cell is made by using a predetermined current, and only HR writing after the forming is performed. In this case, the crosspoint nonvolatile memory device 100 does not need to include the sneak current compensating load current supply unit 8 and the variable voltage source 16.

The control circuit 18 may be implemented to a chip as a test circuit separate from the crosspoint nonvolatile memory device 100.

[Industrial Applicability]

The crosspoint nonvolatile memory device and the forming method used in the device according to the present invention are capable of cancelling a sneak current inherent in the crosspoint nonvolatile memory device to achieve stable forming. Therefore, the present invention is useful as a nonvolatile memory device used in various electronic devices, such as a digital home appliance, a memory card, a mobile phone, and a personal computer.

[Reference Signs List]
1, 110 memory cell array
2 memory cell
2a variable resistance element
2b diode element
3 word line
4 bit line
5 row selection circuit
5a selection switch
6 column selection circuit
7 sense amplification circuit
8 sneak current compensating load current supply unit
8a, 8b, 9a, 9b, 10a, 10b, 11a, 11b P-type MOS transistor
9 reading current detection load current supply unit
10 data "0" verification load current supply unit
11 data "1" verification load current supply unit
12 clamp N-type MOS transistor
13 clamp voltage control circuit
14 differential amplifier
15 writing circuit
16, 17 variable voltage source
18 control circuit
19 fixed resistance element
20 load current control voltage selection switch
21 first via
22 first electrode
23 semiconductor layer
24 second electrode
25 low concentration oxygen layer
26 high concentration oxygen layer
27 third electrode
28 second via
29 insulation layer
100 crosspoint nonvolatile memory device
111 data line drive circuit
112 bit line drive circuit
113 row decoder
114 column decoder
115 sense circuit
120a, 120b reference memory cell array

The invention claimed is:

1. A crosspoint nonvolatile memory device, comprising:
a plurality of word lines parallel to each other on a first plane;
a plurality of bit lines parallel to each other on a second plane parallel to the first plane, the bit lines three-dimensionally crossing the word lines;
a crosspoint memory cell array in which memory cells are arrayed in rows and columns, the memory cells being arranged at respective three-dimensional crosspoints between the word lines and the bit lines, and each of the memory cells including a variable resistance element that is reversibly changed between a first resistance state and a second resistance state that has a higher resistance value than a resistance value of the first resistance state, when receiving an electrical signal;
a word line selector that selects a world line from the word lines;
a bit line selector that selects a bit line from the bit lines;
a writing circuit that applies a forming pulse for forming to a predetermined memory cell among the memory cells, the predetermined memory cell being selected by selecting the bit line by the bit line selector and selecting the word line by the word line selector;
a sense amplification circuit electrically connected to the bit line; and
a control circuit that controls the sense amplification circuit and the writing circuit,
wherein, in an initial state after manufacturing the variable resistance element, the variable resistance element is in a third resistance state that has a higher resistance value than the resistance value of the second resistance state, and after forming is performed, a resistance state of the variable resistance element is changed from the initial state to a state where the resistance state is reversibly changeable between the first resistance state and the second resistance state,
the sense amplification circuit includes a current source that selectively switches a load current among load currents having different current amounts and supplies the load current to the bit line selected by the bit line selector, and the sense amplification circuit outputting a first logical value when a current amount of the load current flowing into the bit line selected by the bit line selector is more than a reference current amount, and outputting a second logical value when the current amount is less than the reference current amount, and
when the predetermined memory cell is selected, before the application of the forming pulse to the predetermined memory cell, (i) the control circuit adjusts the current amount of the load current supplied from the current source to a predetermined current amount that causes the sense amplification circuit to output the second logical value, and (ii) after the adjustment, the control circuit (ii-1) controls the current source to supply the load current having the predetermined current amount, and (ii-2) controls the writing unit to keep applying the forming pulse to the predetermined memory cell until the sense amplification circuit outputs the first logical value.

2. The crosspoint nonvolatile memory device according to claim 1,
wherein the sense amplification circuit includes a differential amplifier that (i) compares a voltage at the bit line selected by the bit line selector to a reference voltage, and (ii) outputs the second logical value when the voltage at the bit line selected by the bit line selector is higher than the reference voltage, and outputs the first logical value when the voltage is lower than the reference voltage.

3. The crosspoint nonvolatile memory device according to claim 1,
wherein the current source selectively switches the load current to be supplied, between a first load current and a second load current that has a more current amount than a current amount of the first load current, and
the sense amplification circuit
outputs the second logical value whichever the load current supplied from the current source is the first load current or the second load current, before the application of the forming pulse to the predetermined memory cell, when the predetermined memory cell is selected in a state where forming has not been performed on all the memory cells in the crosspoint memory cell array, and
outputs (i) the first logical value if the load current supplied from the current source is the first load current and (ii) the second logical value if the load current is the second load current, before the application of the forming pulse to the predetermined memory cell, when the predetermined memory cell is selected in a state where forming has been performed on all the memory cells except the predetermined memory cell in the crosspoint memory cell array.

4. The crosspoint nonvolatile memory device according to claim 3,
wherein the current source includes a Metal Oxide Semiconductor (MOS) transistor,
the crosspoint nonvolatile memory device further comprises a variable voltage source which is connected to a gate terminal of the MOS transistor and which selectively switches a voltage among voltages having different voltage values and applies the voltage to the gate terminal,
the current source selectively switches the load current to be supplied, among at least the first load current, the second load current, and a third load current having a current amount that is more than the current amount of the first load current and less than the current amount of the second load current, and
(i) when the current source is to supply the second load current, the control circuit adjusts a value of the voltage applied from the variable voltage source to cause an output current of the MOS transistor to be more than an output current of the MOS transistor in a case where the current source supplies the third load current, and (ii) when the current source is to supply the third load current, the control circuit adjusts the value of the voltage to cause the output current of the MOS transistor to be more than an output current of the MOS transistor in a case where the current source supplies the first load current.

5. The crosspoint nonvolatile memory device according to claim 1,
wherein the variable resistance element is reversibly changed between the first resistance state and the second resistance state, by receiving voltages having different polarities.

6. The crosspoint nonvolatile memory device according to claim 1,
wherein each of the memory cells includes the variable resistance element and a diode element which are connected in series with each other, the diode element comprising nitrogen-deficient silicon nitride.

7. A forming method used in a crosspoint nonvolatile memory device,
the crosspoint nonvolatile memory device including:
a plurality of word lines parallel to each other on a first plane;
a plurality of bit lines parallel to each other on a second plane parallel to the first plane, the bit lines three-dimensionally crossing the word lines;
a crosspoint memory cell array in which memory cells are arrayed in rows and columns, the memory cells being arranged at respective three-dimensional crosspoints between the word lines and the bit lines, and each of the memory cells including a variable resistance element that is reversibly changed between a first resistance state and a second resistance state that has a higher resistance value than a resistance value of the first resistance state, when receiving an electrical signal;
a word line selector that selects a world line from the word lines;
a bit line selector that selects a bit line from the bit lines;
a writing circuit that applies a forming pulse for forming to a predetermined memory cell among the memory cells, the predetermined memory cell being selected by selecting the bit line by the bit line selector and selecting the word line by the word line selector; and
a sense amplification circuit electrically connected to the bit line,
wherein, in an initial state after manufacturing the variable resistance element, the variable resistance element is in a third resistance state that has a higher resistance value than the resistance value of the second resistance state, and after forming is performed, a resistance state of the variable resistance element is changed from the initial state to a state where the resistance state is reversibly changeable between the first resistance state and the second resistance state, and
the sense amplification circuit includes a current source that selectively switches a load current among load currents having different current amounts and supplies the load current to the bit line selected by the bit line selector, and the sense amplification circuit outputting a first logical value when a current amount of the load current flowing into the bit line selected by the bit line selector is more than a reference current amount, and outputting a second logical value when the current amount is less than the reference current amount,
the forming method applied on the predetermined memory cell, the forming method comprising:
adjusting the current amount of the load current supplied from the current source to a predetermined current amount that causes the sense amplification circuit to output the second logical value, before the application of the forming pulse to the predetermined memory cell, when the predetermined memory cell is selected;
applying the forming pulse to the predetermined memory cell after the adjusting; and
supplying the load current having the predetermined current amount from the current source after the applying, and reading a state of the predetermined memory cell by the sense amplification circuit,
wherein in the supplying and the reading,
when the sense amplification circuit outputs the first logical value, it is determined that the forming has been completed for the predetermined memory cell, and the forming on the predetermined memory cell is terminated, and
when the sense amplification circuit outputs the second logical value, it is determined that the forming has not been completed for the predetermined memory cell, and the applying of the forming pulse is performed again.

8. The forming method according to claim 7,
wherein in the supplying and the reading,
when the sense amplification circuit outputs the first logical value, the predetermined memory cell is changed to be in the second resistance state.

9. The forming method according to claim 7,
wherein an address designating the predetermined memory cell is at least one of: an address indicating that an address designating the word line is switched to another; and an address indicating that an address designating the bit line is switched to another.

10. The forming method according to claim 7,
wherein the variable resistance element is reversibly changed between the first resistance state and the second resistance state, by receiving voltages having different polarities.

11. The forming method according to claim 7,
wherein each of the memory cells includes the variable resistance element and a diode element which are connected in series with each other, the diode element comprising nitrogen-deficient silicon nitride.

* * * * *